United States Patent
Yokoyama

(10) Patent No.: US 8,614,454 B2
(45) Date of Patent: Dec. 24, 2013

(54) SEMICONDUCTOR LIGHT-EMITTING DEVICE, MANUFACTURING METHOD THEREOF, AND LAMP

(75) Inventor: Yasunori Yokoyama, Ichihara (JP)

(73) Assignee: Toyoda Gosei Co., Ltd., Aichi (JP)

(*) Notice: Subject to any disclaimer, the term of this patent is extended or adjusted under 35 U.S.C. 154(b) by 0 days.

(21) Appl. No.: 13/287,309

(22) Filed: Nov. 2, 2011

(65) Prior Publication Data
US 2012/0112188 A1 May 10, 2012

(30) Foreign Application Priority Data
Nov. 8, 2010 (JP) .................. 2010-249987

(51) Int. Cl.
*H01L 33/00* (2010.01)

(52) U.S. Cl.
USPC ........... 257/98; 257/E33.003; 257/E33.067; 257/E33.068; 257/E33.043; 439/29

(58) Field of Classification Search
USPC ............. 257/98, E33.003, E33.067, E33.068, 257/E33.074, E33.004, E33.043; 438/29
See application file for complete search history.

(56) References Cited

FOREIGN PATENT DOCUMENTS

| JP | 2002-280611 A | 9/2002 |
|----|---------------|--------|
| JP | 2009-123717 A | 6/2009 |

*Primary Examiner* — Amar Movva
(74) *Attorney, Agent, or Firm* — Sughrue Mion, PLLC

(57) ABSTRACT

A semiconductor light-emitting device which includes: a single-crystal substrate formed with a plurality of projection portions on a c-plane main surface; an intermediate layer which is formed to cover the main surface of the single-crystal substrate, in which a film thickness $t_2$ on the projection portion is smaller than a film thickness $t_1$ on the c-plane surface, in which the film thickness $t_2$ on the projection portion is 60% or more of the film thickness $t_1$ on the c-plane surface, and which includes AlN having a single-crystal phase on the c-plane surface and a polycrystalline phase on the projection portion; and a semiconductor layer which is formed on the intermediate layer and includes a group III nitride semiconductor.

8 Claims, 8 Drawing Sheets

SEMICONDUCTOR LIGHT-EMITTING DEVICE, MANUFACTURING METHOD THEREOF, AND LAMP

CROSS-REFERENCE TO RELATED APPLICATION

This application claims priority of Japanese Patent Application No. 2010-249987 filed Nov. 8, 2010, the content of which is incorporated herein by reference in its entirety.

BACKGROUND OF THE INVENTION

1. Field of the Invention

The present invention relates to a semiconductor light-emitting device, a manufacturing method thereof, and a lamp, and more particularly, to a semiconductor light-emitting device and a manufacturing method thereof which are capable of providing a lamp having a small output decrease in a high temperature environment.

2. Description of Related Art

As a semiconductor light-emitting device such as an LED (Light-Emitting Diode) used in a lamp, a technique has been used in which a group III nitride semiconductor layer is stacked on a sapphire single-crystal substrate.

In recent years, as such a semiconductor light-emitting device, a technique has been proposed in which recesses and projections are formed on a surface of a sapphire substrate and a group III nitride semiconductor layer is grown thereon (for example, refer to JP-A-2002-280611). In such a semiconductor light-emitting device, since an interface between the sapphire substrate and the group III nitride semiconductor layer is formed in a concave and projection shape, light on the interface is irregularly reflected due to different refractive indexes of the sapphire substrate and the group III nitride semiconductor layer, and thus it is possible to reduce the containment of light in the light-emitting device and to enhance light extraction efficiency.

Furthermore, as a group III nitride semiconductor light-emitting device having high light extraction efficiency, a technique has been proposed in which a group III nitride semiconductor layer is grown on a (0001) c-plane surface of sapphire substrate and an upper surface formed with a plurality of projection portions are formed (for example, refer to JP-A-2009-123717).

SUMMARY OF THE INVENTION

However, in a case where recesses and projections are formed on a surface of a sapphire substrate and a group III nitride semiconductor layer is epitaxially grown thereon, it is difficult to grow a group III nitride semiconductor layer having excellent crystallinity.

For example, in a case where a projection portion is formed on a c-plane surface of a sapphire substrate and a group III nitride semiconductor layer which includes GaN of a single-crystal is epitaxially grown thereon, a crystalline defect such as dislocation tends to occur in a portion in which a semiconductor layer grown from a top portion of the projection portion and a semiconductor layer grown from the c-plane surface disposed around a base portion of the projection portion are merged, thereby making it difficult to grow a semiconductor layer having excellent crystallinity.

Furthermore, the crystallinity of the group III nitride semiconductor layer grown on the substrate influences the crystallinity of a semiconductor layer which forms an LED structure stacked on the group III nitride semiconductor layer. Thus, if the crystallinity of the group III nitride semiconductor layer grown on the substrate is not good, the crystallinity of the semiconductor layer of the LED structure also deteriorates. As a result, in a case where the recesses and projections are formed on the surface of the sapphire substrate, although light extraction efficiency of the light-emitting device is enhanced, an output decrease in a high temperature environment is noticeable.

Accordingly, an object of the present invention is to provide a semiconductor light-emitting device which includes a projection portion on a c-plane surface of a substrate and a semiconductor layer having excellent crystallinity on the substrate and is capable of providing a lamp having a small output decrease in a high temperature environment.

It is another object of the present invention to provide a manufacturing method of a semiconductor light-emitting device which is capable of providing a lamp having a small output decrease in a high temperature environment.

It is still another object of the present invention to provide a lamp including such a semiconductor light-emitting device, with a small output decrease in a high temperature environment.

To solve the above problems, the present invention provides the following configurations.

(1) A semiconductor light-emitting device including: a single-crystal substrate, comprised c-plane main surface having a c-plane surface and a plurality of projection portions which are formed on the c-plane main surface of the single-crystal substrate; an intermediate layer which is formed to cover the main surface of the single-crystal substrate and includes AlN having a single-crystal phase on the c-plane surface and a polycrystalline phase on the projection portion where a film thickness $t_2$ on the projection portion is smaller than a film thickness $t_1$ on the c-plane surface, the film thickness $t_2$ on the projection portion is 60% or more of the film thickness $t_1$ on the c-plane surface; and a semiconductor layer which is stacked on the intermediate layer and includes a group III nitride semiconductor.

(2) The semiconductor light-emitting device according to (1), wherein the single-crystal phase is continuously formed on the c-plane surface.

(3) The semiconductor light-emitting device according to (1) or (2), wherein the intermediate layer on the projection portion includes an amorphous phase.

(4) The semiconductor light-emitting device according to any one of (1) to (3), wherein the projection portion has a base width of 0.05 to 5 μm and a height of 0.05 to 5 μm, the height is ¼ or more of the base width, and an interval between the adjacent projection portions is 0.5 to 5 times the base width.

(5) The semiconductor light-emitting device according to any one of (1) to (4), wherein a group III nitride semiconductor layer which includes composition of $Al_xGa_yN_{1-x-y}$ ($0 \leq x \leq 1$, $0 \leq y \leq 1$, $x+y=1$) is formed between the intermediate layer and the semiconductor layer.

(6) A manufacturing method of a semiconductor light-emitting device, the method including the steps of: forming a plurality of projection portions on a c-plane main surface of a single-crystal substrate, and obtaining the main surface comprising a c-plane surface and the plurality of projection portions; forming an intermediate layer which includes AlN on the main surface of the single-crystal substrate by a plasma sputtering method using Al as a target; and forming a semiconductor layer which includes a group III nitride semiconductor on the intermediate layer, wherein when the height of the projection portion is h, the maximum diameter of the projection portion is d, the maximum diameter of the target is D, and the distance between the target and the c-plane surface of the single-crystal substrate is H, the intermediate layer is formed under the condition that the relationship of D/H>d/h is established, in the intermediate layer forming step.

(7) The manufacturing method of the semiconductor light-emitting device according to (6), wherein the intermediate layer is formed by disposing the c-plane surface of the single-crystal substrate in plasma, in the intermediate forming step.

(8) A lamp comprising the semiconductor light-emitting device according to any one of (1) to (5).

The semiconductor light-emitting device according to the present invention includes: the single-crystal substrate, comprised c-plane main surface having a c-plane surface and a plurality of projection portions which are formed on the c-plane main surface of the single-crystal substrate; the intermediate layer which is formed to cover the main surface of the single-crystal substrate and includes AlN having the single-crystal phase on the c-plane surface and the polycrystalline phase on the projection portion wherein the film thickness $t_2$ on the projection portion is smaller than the film thickness $t_1$ on the c-plane surface ($t_2 < t_1$), and the film thickness $t_2$ on the projection portion is 60% or more of the film thickness $t_1$ on the c-plane surface; and the semiconductor layer which is formed on the intermediate layer and includes the group III nitride semiconductor. Thus, a dislocation density of the semiconductor layer formed on the intermediate layer is decreased, and the crystallinity of the semiconductor layer is improved. Here, the film thickness $t_2$ of the intermediate layer formed on the projection portion of the single-crystal substrate is smaller than the film thickness $t_1$ of the intermediate layer formed on the c-plane surface, and thus, the relationship of $t_2 < t_1$ is established. As a result, the semiconductor light-emitting device according to the present invention can form a lamp which has a small output decrease at a high temperature environment and excellent temperature characteristics.

Furthermore, the manufacturing method of the semiconductor light-emitting device according to the present invention includes the steps of: forming a plurality of projection portions on a c-plane main surface of a single-crystal substrate, and obtaining the main surface comprising a c-plane surface and the plurality of projection portions; forming the intermediate layer which includes AlN the main surface of the single-crystal substrate by the plasma sputtering method using Al as the target; and forming the semiconductor layer which includes the group III nitride semiconductor on the intermediate layer, wherein when the height of the projection portion is h, the maximum diameter of the projection portion is d, the maximum diameter of the target is D, and the distance between the target and the c-plane surface of the single-crystal substrate is H, the intermediate layer is formed under the condition that the relationship of D/H>d/h is established, in the intermediate layer forming step. Thus, the thickness of the intermediate layer becomes non-uniform, and the crystallinity of the semiconductor layer formed on the intermediate layer is improved. As a result, according to the manufacturing method of the semiconductor light-emitting device according to the present invention, it is possible to provide a semiconductor light-emitting device having high light-emitting characteristics (temperature characteristics) in a high temperature state.

More specifically, since the intermediate layer is formed under the condition that the relationship of D/H>d/h is established in the intermediate layer forming step, sputtering particles enter over a wide incident angle range in an entire area of the single-crystal substrate, the intermediate layer is also formed at a sufficiently thick thickness on the projection portion in a similar way to the c-plane surface regardless of the position on the single-crystal substrate, the ratio of the thickness on the projection portion and the thickness on the c-plane surface on the single-crystal substrate is within the specific range, and the intermediate layer having the single-crystal phase on the c-plane surface and the polycrystalline phase on the projection portion is obtained. As a result, according to the manufacturing method of the semiconductor light-emitting device according to the present invention, the dislocation density of the semiconductor layer formed on the intermediate layer is decreased, and the crystallinity of the semiconductor layer is improved.

Furthermore, the lamp according to the present invention includes the semiconductor light-emitting device according to the present invention in which the semiconductor layer has excellent crystallinity, and thus, has a small output decrease in a high temperature environment.

DETAILED DESCRIPTION OF THE INVENTION

Figure 1:
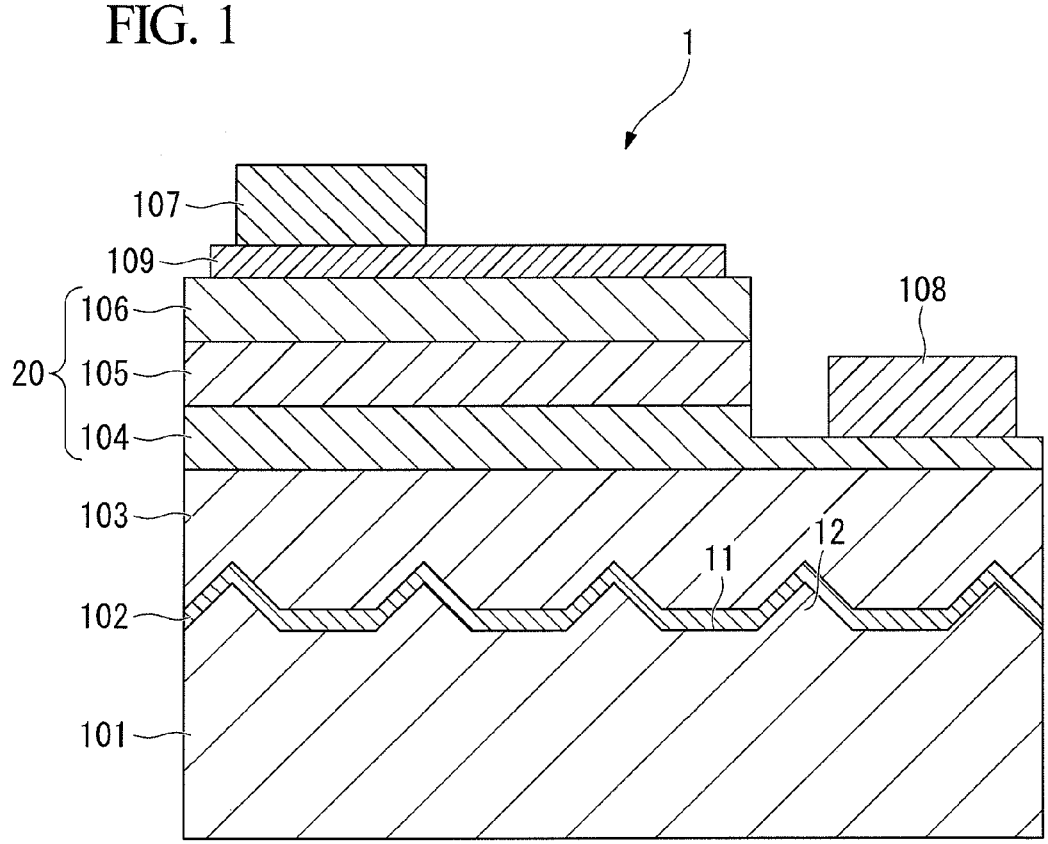
FIG. 1 is a cross-sectional diagram illustrating an example of a semiconductor light-emitting device according to the present invention.

Hereinafter, embodiments will be described in detail with reference to the accompanying drawings. In the drawings used in the following description, a characteristic part may be enlarged for description of the present invention, and a size ratio of respective elements does not necessarily reflect actual sizes.

[Semiconductor Light-Emitting Device]

FIG. 1 is a cross-sectional view illustrating an example of a semiconductor light-emitting device 1 according to an embodiment. The semiconductor light-emitting device 1 shown in FIG. 1 (hereinafter, may be simply referred to as a "light-emitting device") includes a substrate (single-crystal substrate) 101 in which a plurality of projection portions 12 is formed, an intermediate layer 102 (buffer layer) which is formed to cover the substrate 101, a group III nitride semiconductor layer 103 which is stacked on the intermediate layer 102, and an LED structure (a semiconductor layer including a light-emitting layer is also referred to as an LED structure) 20 which is formed on the group III nitride semiconductor layer 103.

As shown in FIG. 1, it is preferable that the group III nitride semiconductor layer 103 be formed between the intermediate layer 102 and the LED structure 20 (semiconductor layer) so as to improve crystallinity of the LED structure 20. Here, the LED structure 20 may be formed in contact with the intermediate layer 102.

Furthermore, the LED structure 20 shown in FIG. 1 is formed by sequentially stacking the respective layers of an n-type semiconductor layer 104, a light-emitting layer 105 and a p-type semiconductor layer 106.

Furthermore, in FIG. 1, a reference numeral 107 represents a positive electrode bonding pad, and a reference numeral 108 represents a negative electrode bonding pad.

Figure 2:
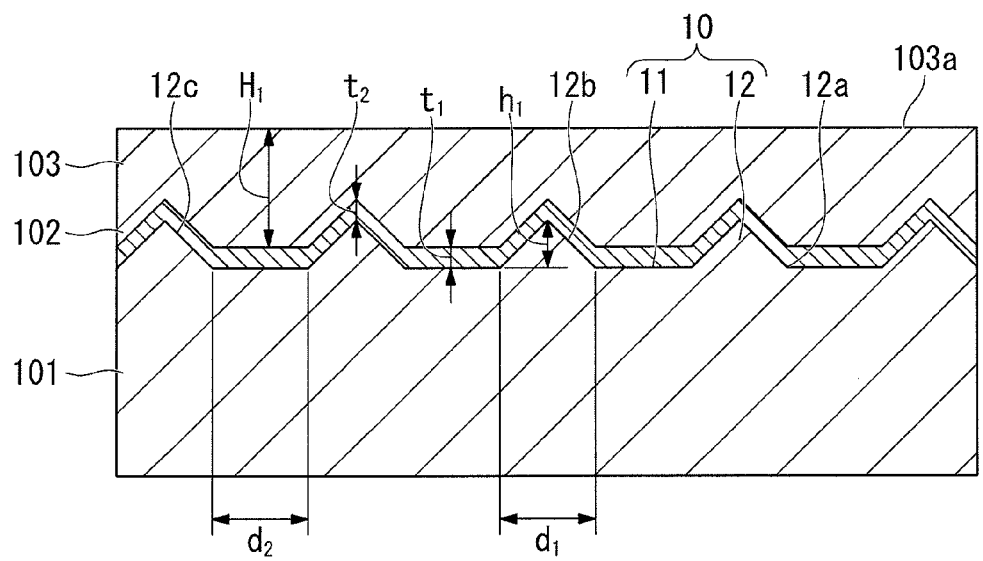
FIG. 2 is a partially enlarged view illustrating a substrate, an intermediate layer and a group III nitride semiconductor layer in the semiconductor light-emitting device shown in FIG. 1.
Figure 3:
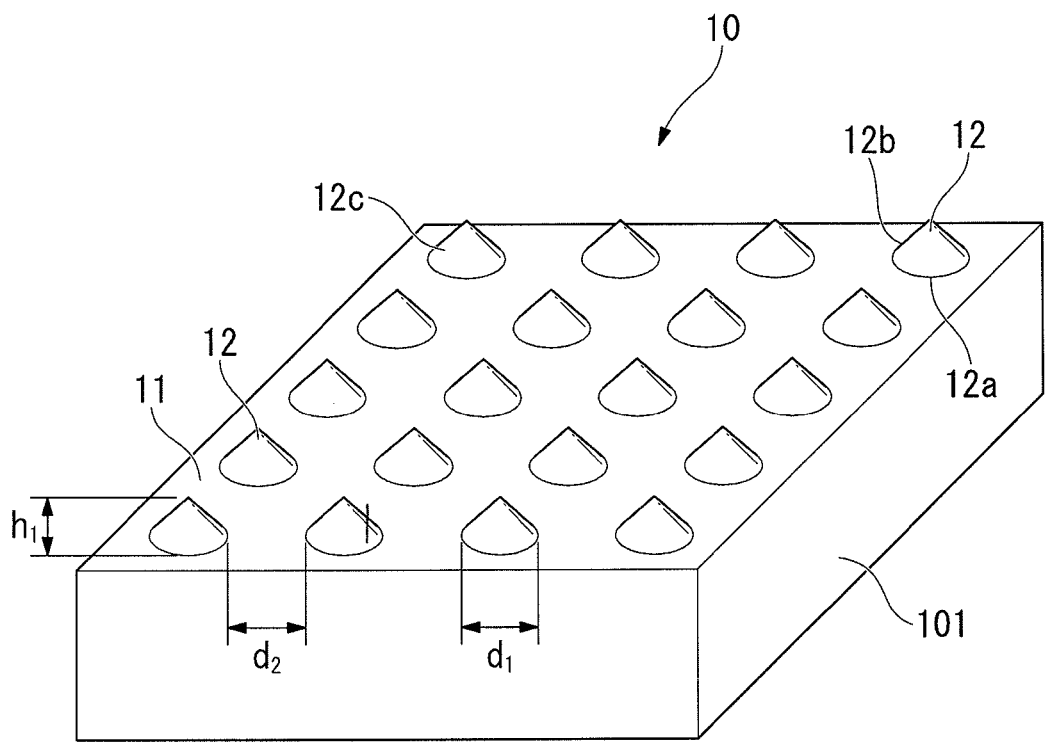
FIG. 3 is an example of a plan view illustrating only a substrate which forms the semiconductor light-emitting device shown in FIG. 1.

Furthermore, FIG. 2 is a partially enlarged view illustrating the substrate 101, the intermediate layer 102 and the group III nitride semiconductor layer 103 in the light-emitting device 1 shown in FIG. 1, and FIG. 3 is a plan view illustrating only the substrate 101 which forms the light-emitting device 1 shown in FIG. 1.

Figure 4:
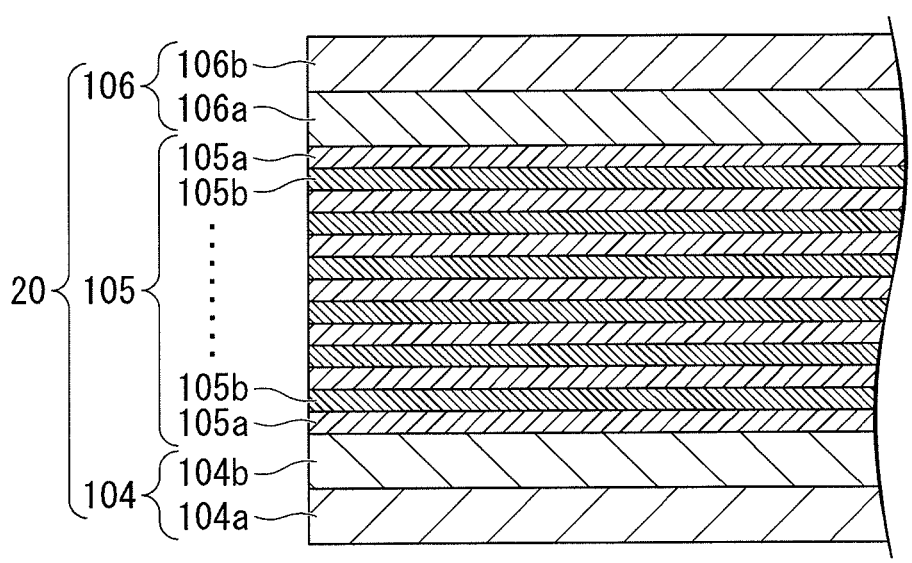
FIG. 4 is an example of a partially enlarged view illustrating an n-type semiconductor layer, a light-emitting layer and a p-type semiconductor layer which form an LED structure in the semiconductor light-emitting device shown in FIG. 1.

Furthermore, FIG. 4 is a partially enlarged view illustrating the n-type semiconductor layer 104, the light-emitting layer 105 and the p-type semiconductor layer 106 which form the LED structure 20 in the light-emitting device 1 shown in FIG. 1.

[Shape of Substrate]

As shown in FIGS. 2 and 3, the plurality of projection portions 12 is formed on a c-plane upper surface (main surface) 10 of the substrate 101 which forms the light-emitting device 1 shown in FIG. 1. As shown in FIG. 3, a portion where the projection portions 12 are not formed on the upper surface 10 of the substrate 101 is a plane which is the (0001) c-plane surface 11. Accordingly, as shown in FIGS. 2 and 3, the upper surface 10 of the substrate 101 includes the (0001) c-plane surface 11 which is the plane and the plurality of projection portions 12.

As shown in FIGS. 2 and 3, each projection portion 12 includes a surface 12c which is not parallel to the c-plane surface 11, and a (0001) c-plane does not appear on the surface 12c. A crystal plane is exposed on an inclined surface which forms a side surface 12b.

In the present embodiment, the plane which is the (0001) c-plane surface 11 includes a plane obtained by assigning an off angle in the range of ±3° with respect to the (0001) direction to a planar orientation of the plane. Furthermore, the surface 12c which is not parallel with the c-plane surface 11 refers to a surface 12c which is not a surface which is parallel with the (0001) c-plane surface 11 in the range of ±3°.

The projection portion 12 shown in FIGS. 1 to 3 has a base portion 12a of an approximately circular shape from a planar view, and has an approximately conical shape (including a conical shape) in which the outer size becomes gradually smaller as it goes upward. Furthermore, as shown in FIGS. 1 to 3, the projection portions 12 are arranged at regular intervals in a checkerboard shape from a planar view.

In the present embodiment, as shown in FIGS. 1 and 2, the projection portion 12 has a base width $d_1$ of 0.05 to 5 μm, a height h of 0.05 to 5 μm. The height h is ¼ or more of the base width $d_1$, and an interval $d_2$ between the adjacent projection portions 12 is 0.5 to 5 times the base width $d_1$. Here, the base width $d_1$ of the projection portion 12 refers to the largest width on the bottom side (base portion 12a) of the projection portion 12 (largest diameter of the projection portion 12). Furthermore, the interval $d_2$ between the adjacent projection portions 12 refers to the distance between edges of the base portions 12a of the closest projection portions 12.

It is preferable that the interval $d_2$ between the adjacent projection portions 12 be 0.5 to 5 times the base width $d_1$. If the interval $d_2$ between the adjacent projection portions 12 is smaller than 0.5 times the base width $d_1$, when the base layer (group III nitride semiconductor layer 103) is epitaxially grown through the intermediate layer (buffer layer) 102 on the substrate 101, a dislocation density which occurs at the time of facet growth together with the crystal growth from the c-plane surface 11 is likely to be increased. As a result, the dislocation density of the group III nitride semiconductor which becomes the LED structure 20 formed on the intermediate layer 102 is increased, which causes deterioration of output, electric characteristics or the like of the light-emitting device 1. Furthermore, if the interval $d_2$ between the projection portions 12 exceeds 5 times the base width $d_1$, the opportunity for diffuse reflection of light in an interface between the substrate 101 and the intermediate layer 102 formed on the substrate 101 is reduced, and thus, light extraction efficiency may not be sufficiently enhanced.

Furthermore, it is preferable that the base width $d_1$ be 0.05 to 5 μm. If the base width $d_1$ is smaller than 0.05 μm, in a case where the light-emitting device 1 is formed using the substrate 101, the effect of light diffuse reflection may not be sufficiently achieved. Furthermore, if the base width $d_1$ exceeds 5 μm, an area where the facet growth is performed together with the crystal growth from the c-plane surface 11 is enlarged, which deteriorates flatness of the surface of the group III nitride semiconductor layer 103 which covers an upper portion of the projection portion 12, and thus, the crystallinity of the group III nitride semiconductor layer 103 which becomes the LED structure 20 may be insufficient.

Furthermore, it is preferable that the height h of the projection portion 12 is 0.05 to 5 μm. If the height h of the projection portion 12 is smaller than 0.05 μm, in a case where the light-emitting device 1 is formed using the substrate 101, the effect of light diffuse reflection may not be sufficiently achieved and it is difficult to form a uniform base layer (group III nitride semiconductor layer 103). Furthermore, if the height h of the projection portion 12 exceeds 5 μm, the film thickness of the semiconductor layer 103 for obtaining the group III nitride semiconductor layer 103 having a flat surface 103a becomes thick. Further, in the range of a predetermined thickness of the group III nitride semiconductor layer 103, a pit on the projection portion 12 is not covered, which causes a problem in surface flatness of the group III nitride semiconductor layer 103. Furthermore, if the group III nitride semiconductor layer 103 is grown so as to improve the surface flatness of the group III nitride semiconductor layer 103, this causes a significant cost increase, which is not practically preferable.

Furthermore, it is preferable that the height h of the projection portion 12 be ¼ or more of the base width $d_1$. If the height h of the projection portion 12 is smaller than ¼ of the base width $d_1$, in a case where the light-emitting device 1 is formed using the substrate 101, the effect of light diffuse reflection or light extraction efficiency enhancement may not be sufficiently obtained.

The shape of the projection portion 12 is not limited to the example shown in FIGS. 1 and 3, and may have any shape as long as it includes a surface which is not parallel to the c-plane surface 11. For example, the shape may be a bowl shape (hemispherical shape) of which a side surface is outwardly curved, or may be a shape in which the base is an approximately polygonal shape from a planar view in which the outer size becomes gradually smaller as it goes upward and a side surface is outwardly curved. Furthermore, the shape may be an approximately pyramidal shape a side surface of which is formed of an inclined surface in which the outer size becomes gradually smaller as it goes upward. Furthermore, the shape may be a shape in which an inclined angle of a side surface is changed at multiple stages.

Furthermore, the projection portions 12 may be arranged at regular or irregular intervals from a planar view, without limitation to the example as shown in FIGS. 1 to 3. Furthermore, in a case where the projection portions 12 are arranged at regular intervals, the planar arrangement of the projection portions 12 may be a rectangular shape, a triangular shape, or a random shape.

(Substrate Material)

In the light-emitting device 1 according to the present embodiment, a material used in the substrate 101 may be a single-crystal substrate material which has a c-plane main surface capable of epitaxially growing the group III nitride semiconductor layer 103 which is a layer formed on the substrate 101 in contact therewith or the group III nitride semiconductor layer which forms the LED structure 20, on the surface thereof. However, the material is not limited thereto, and a variety of materials may be selected for use.

In the present embodiment, particularly, as the substrate 101, it is preferable to use sapphire single-crystal using the (0001) c-plane as the main surface.

(Intermediate Layer)

As shown in FIGS. 1 and 2, the intermediate layer (buffer layer) 102 including AlN is formed on the substrate 101 to cover the upper surface 10 of the substrate 101. The intermediate layer 102 can improve the crystallinity of the group III nitride semiconductor layer 103 and the LED structure 20 (or the LED structure 20) by decreasing a difference in lattice constant between the substrate 101 and the group III nitride semiconductor layer 103 (the LED structure 20 in a case where the group III nitride semiconductor layer 103 is not formed).

The intermediate layer 102 on the c-plane surface 11 is formed of AlN which has a single-crystalline phase. In the present embodiment, the single-crystalline phase of AlN is continuously formed on the c-plane surface 11. Thus, by epitaxially growing the single-crystalline phase oriented in a C-axial direction only from the single-crystalline phase of the intermediate layer 102 formed on the c-plane surface 11, it is possible to easily form the group III nitride semiconductor layer 103 having excellent crystallinity on the intermediate layer 102. Furthermore, by forming the group III nitride semiconductor layer which becomes the LED structure 20 on the group III nitride semiconductor layer 103, it is possible to achieve the LED structure 20 having excellent crystallinity.

Furthermore, the intermediate layer 102 on the projection portion 12 is formed of AlN including a polycrystalline phase, and includes an AlN which is an amorphous phase.

The intermediate layer 102 formed of AlN including the polycrystalline phase does not serve as a buffer layer. Accordingly, the group III nitride semiconductor layer 103 which is grown on the intermediate layer 102 formed of AlN including the polycrystalline phase on the projection portion 12 becomes polycrystalline without the epitaxial growth. However, the single-crystal group III nitride semiconductor layer 103 which is grown from the intermediate layer 102 formed of AlN of the single-crystal phase formed on the c-plane surface 11 is grown in a transverse direction to cover the group III nitride semiconductor layer 103 on the projection portion 12, and dislocation through the projection portion converges. As a result, the crystallinity of the group III nitride semiconductor layer 103 is improved. Furthermore, the light-emitting device 1 according to the present embodiment has the amorphous phase in the intermediate layer 102 formed on the projection portion 12 of the substrate 101. The intermediate layer 102 formed of the amorphous phase AlN does not serve as the buffer layer at all, and the group III nitride semiconductor layer 103 is not grown on the intermediate layer 102 formed of the amorphous phase AlN. In this way, in the light-emitting device 1 according to the present embodiment, dislocation and defects hardly occur in crystals of the group III nitride semiconductor layer 103 on the projection portion 12, and thus, crystallinity thereof is improved.

Furthermore, as shown in FIG. 2, in the intermediate layer 102, a film thickness $t_2$ on the projection portion 12 is smaller than a film thickness $t_1$ on the c-plane surface 11, the film thickness $t_2$ on the projection portion 12 is 60% or more (($t_2/t_1$)×100≥60(%)) of the film thickness $t_1$ on the c-plane surface 11 of the substrate 101, and preferably 60(%) to 90(%). If the film thickness $t_2$ on the projection portion 12 is smaller than 60% of the film thickness $t_1$ on the c-plane surface 11 of the substrate 101, the intermediate layer 102 on the projection portion becomes a polycrystalline phase, and includes an amorphous layer. Furthermore, the crystallinity of the intermediate layer 102 on the c-plane surface 11 deteriorates, and the polycrystalline phase is grown in this area. As a result, the dislocation density of the group III nitride semiconductor layer 103 which becomes the LED structure 20 formed on the intermediate layer 102 is increased, and thus, light emission output, electrical characteristics or temperature characteristics of the semiconductor light-emitting device 1 become insufficient.

In this way, in the intermediate layer 102, the relationship of thickness $t_2$ < thickness $t_1$ is preferable in the thickness $t_2$ on the projection portion and the thickness $t_1$ on the c-plane surface 11, and the thickness $t_2$ on the projection portion 12 with respect to the thickness $t_1$ on the c-plane surface 11 of the substrate 101 is 60% or more (($t_2/t_1$)×100≥60(%)). Furthermore, the intermediate layer 102 is formed of AlN which has the single-crystal phase on the c-plane surface 11 and the polycrystalline phase on the projection portion 12. Thus, the dislocation density of the layer (in the present embodiment, the group III nitride semiconductor layer 103) stacked on the intermediate layer 102 is reduced, and the group III nitride semiconductor layer 103 which becomes the LED structure 20 formed on the group III nitride semiconductor layer 103 has excellent crystallinity. As a result, the semiconductor light-emitting device including the group III nitride semiconductor according to the present embodiment can maintain high light emission characteristics (temperature characteristics) in a high temperature state.

Furthermore, it is preferable that the thickness of the intermediate layer 102 on the c-plane surface 11 be 0.01 to 0.5 μm. If the thickness of the intermediate layer 102 on the c-plane surface 11 is smaller than 0.01 μm, the effect that the difference in lattice constant between the substrate 101 and the group III nitride semiconductor layer 103 (the LED structure 20 in a case where the group III nitride semiconductor layer 103 is not formed) is alleviated may not be sufficiently achieved by the intermediate layer 102. Furthermore, if the thickness of the intermediate layer 102 on the c-plane surface 11 exceeds 0.5 μm, although there is no change in the function of the intermediate layer 102, the film formation processing time of the intermediate layer 102 is lengthened, and thus, productivity may be lowered.

(Group III Nitride Semiconductor Layer)

As shown in FIG. 1, on the intermediate layer 102, the group III nitride semiconductor layer 103 is stacked to cover irregularities caused as the projection portions 12 are formed. Thus, in the present embodiment, the crystallinity of the group III nitride semiconductor layer 103 which becomes the LED structure 20 formed on the group III nitride semiconductor layer 103 becomes further favorable.

If a maximum thickness $H_1$ of the group III nitride semiconductor layer 103, as shown in FIG. 2, is two or more times the height $h_1$ of the projection portion 12, the group III nitride semiconductor layer 103 of which the surface 103a is flat is obtained, which is preferable. If the maximum thickness $H_1$ of the group III nitride semiconductor layer 103 is smaller than two times the height $h_1$ of the projection portion 12, the flatness of the surface 103a of the group III nitride semiconductor layer 103 which is grown by covering the projection portion 12 becomes insufficient, and thus, the crystallinity of the group III nitride semiconductor layer which forms the LED structure 20 stacked on the group III nitride semiconductor layer 103 is deteriorated.

As the group III nitride semiconductor layer 103, a layer including $Al_xGa_yIn_zN$ ($0 \leq x \leq 1$, $0 \leq y \leq 1$, $0 \leq z \leq 1$, and $x+y+z=1$) may be used, for example. Particularly, in a case where the group III nitride semiconductor layer 103 has a composition including $Al_xGa_yN_{1-x-y}$ ($0 \leq x \leq 1$, $0 \leq y \leq 1$, and $x+y=1$), the group III nitride semiconductor 103 of excellent crystallinity is obtained, which is preferable.

Furthermore, in order to obtain excellent crystallinity of the group III nitride semiconductor layer 103, it is preferable that the group III nitride semiconductor layer 103 be not doped with impurities. However, in a case where the p-type or n-type conductive property is necessary, acceptor impurities or donor impurities may be added.

(LED Structure (Semiconductor Layer))

The LED structure 20 includes the n-type semiconductor layer 104, the light-emitting layer 105 and the p-type semiconductor layer 106, each of which is made of the group III nitride semiconductor. The LED structure 20 is formed by the MOCVD method, to thereby obtain excellent crystallinity.

As shown in FIG. 4, the n-type semiconductor layer 104 generally includes an n-type contact layer 104a and an n-type cladding layer 104b. Furthermore, the n-type contact layer 104a may also serve as the n-type cladding layer 104b.

The n-type contact layer 104a is a layer used for providing a negative electrode. The n-type contact layer 104a is preferably doped with n-type impurities. The concentration of the n-type impurities is $1\times10^{17}$ to $1\times10^{20}/cm^3$, and preferably $1\times10^{18}$ to $1\times10^{19}/cm^3$, in view of maintenance of excellent ohmic contact with the negative electrode. There is no particular limitation to the n-type impurities. For example, Si, Ge, Sn and the like may be used, and Si and Ge may be preferably used.

The n-type cladding layer 104b is a layer which is used for performing carrier injection into and carrier confinement within the light-emitting layer 105. The n-type dopant concentration of the n-type cladding layer 104b is preferably $1\times10^{17}$ to $1\times10^{20}/cm^3$, and more preferably $1\times10^{18}$ to $1\times10^{19}/cm^3$. If the dopant concentration is within this range, it is preferable in view of maintenance of excellent crystallinity and operation voltage reduction of the device.

Furthermore, the n-type cladding layer 104b may also adopt a super-lattice structure. If the n-type cladding layer 104b is a layer including the super-lattice structure, the light emission output is significantly enhanced, to thereby obtain a light-emitting device 1 having excellent electrical characteristics.

As the light-emitting layer 105, there is a light-emitting layer 105 which has a single quantum well structure, a multiple quantum well structure, or the like. As shown in FIG. 4, the light-emitting layer 105 of the multiple quantum well structure includes a well layer 105b and a barrier layer 105a which exhibits band gap energy larger than that of the well layer 105b. Furthermore, the well layer 105b and the barrier layer 105a may be or may not be doped with impurities.

As shown in FIG. 4, it is preferable that the p-type semiconductor layer 106 include a p-type cladding layer 106a and a p-type contact layer 106b. Here, the p-type contact layer 106b may also function as the p-type cladding layer 106a.

The p-type cladding layer 106a is a layer which is used for performing carrier injection into and carrier confinement within the light-emitting layer 105. As the p-type cladding layer 106a, there is no particular limitation as long as it has a composition which is larger than the band gap energy of the light-emitting layer 105 and can perform carrier confinement within the light-emitting layer 105, but preferably $Al_xGa_{1-x}N$ ($0<x \leq 0.4$) is used. If the p-type cladding layer 106a includes AlGaN in this way, it is preferable in view of carrier confinement within the light-emitting layer.

The dopant concentration of the p-type cladding layer 106a is preferably $1\times10^{18}$ to $1\times10^{21}/cm^3$, and more preferably $1\times10^{19}$ to $1\times10^{20}/cm^3$. If the p-type dopant concentration is within the above range, excellent p-type crystals can be obtained without deterioration of the crystallinity.

Furthermore, the p-type cladding layer 106a may be formed as a super-lattice structure in which a plurality of layers is formed. In a case where the p-type cladding layer 106a is made into a layer having a super-lattice structure, light emission output is significantly enhanced, and thus, the light-emitting device 1 with excellent electrical characteristics is obtained.

The p-type contact layer 106b is a layer used for providing a positive electrode. The p-type contact layer 106b is preferably formed of $Al_xGa_{1-x}N$ ($0 \leq x \leq 0.4$). An Al composition within the above range is preferable in view of maintenance of excellent crystallinity and superior ohmic contact with a p-type ohmic electrode. Incorporating p-type impurities (dopant) at a concentration of $1\times10^{18}$ to $1\times10^{21}/cm^3$, and more preferably at a concentration of $5\times10^{19}$ to $5\times10^{20}/cm^3$ in the p-type contact layer 106b is preferable in view of maintenance of excellent ohmic contact, prevention of the occurrence of cracking, and maintenance of excellent crystallinity. There is no particular limitation to the p-type impurities, but Mg is preferable, for example.

(Electrode)

The positive electrode bonding pad 107 is formed on a part of a light-transmissive positive electrode 109 including a light-transmissive conducting oxide layer and being in contact with the p-type semiconductor layer 106.

The light-transmissive positive electrode 109 may be formed by well-known means in this technical field with a material including at least one selected from ITO ($In_2O_3$—$SnO_2$), AZO (ZnO—$Al_2O_3$), IZO ($In_2O_3$—ZnO), and GZO (ZnO—$Ga_2O_3$). Furthermore, a structure of the light-transmissive positive electrode 109 may be used without any limitation, including any known structure in the related art. Furthermore, the light-transmissive positive electrode 109 may be formed to cover approximately the entire surface on the p-type semiconductor layer 106, or may be formed in a lattice shape or tree shape with gaps therein.

The positive electrode bonding pad 107 is formed for electric connection with a circuit board, a lead frame or the like. As the positive electrode bonding pad 107, a variety of structures using Au, Al, Ni, Cu and the like are known, and the known materials and structures may be used without any limitation.

The negative electrode bonding pad 108 is formed to be in contact with the n-type semiconductor layer 104 of the LED structure 20. Thus, when the negative electrode bonding pad 108 is formed, the n-type contact layer of the n-type semiconductor layer 104 is exposed by removing parts of the light-emitting layer 105 and the p-type semiconductor layer 106, and then the negative electrode bonding pad 108 is formed thereon.

As the negative electrode bonding pad 108, a variety of known compositions or structures may be used without any limitation. Furthermore, well-known means in this technical field may be used.

[Manufacturing Method of Semiconductor Light-Emitting Device]

Hereinafter, an embodiment of the manufacturing method of the semiconductor light-emitting device according to the present invention will be described with reference to the drawings.

(Substrate Treatment Process)

In a substrate treatment process, as shown in FIG. 3, the plurality of projection portions 12 is formed on the c-plane upper surface 10 (main surface) of the substrate 101. In the substrate treatment process according to the present embodiment, a patterning process of forming a mask which defines a planar arrangement of the projection portions 12 on the substrate 101 and an etching process of forming the projection portions 12 by etching the substrate 101 using the mask formed by the patterning process are performed.

The patterning process may be performed using a general photolithography method. Since it is preferable that the base width $d_1$ of the base portion 12a of the projection portion 12 formed in the substrate treatment process be 5 μm or less, it is preferable that a sputtering exposure method in the photolithography method be used to uniformly pattern the entire surface of the substrate 101. However, in order to form the pattern of the projection portions 12 having the base width $d_1$ of 1 μm or less, an expensive sputtering apparatus is necessary, which results in a cost increase. Thus, in a case where the pattern of the projection portions having the projection portion width $d_1$ of 1 μm or less is formed, a laser exposure method used in an optical disc field or a nanoimprint method is preferably used.

As a method of etching the substrate 101 in the etching process, dry etching or wet etching is used. In a case where the wet etching is used as the etching method, since the crystal plane of the substrate 101 is exposed, it is difficult to form the projection portion 12 including the non-parallel surface 12c on the substrate 101. Thus, it is preferable to use the dry etching.

The projection portion 12 including the non-parallel surface 12c may be formed by dry-etching the substrate 101 until the mask formed in the above-described patterning process is removed. More specifically, for example, a post-baking process is performed in which a resist is formed on the substrate 101 and is patterned in a predetermined shape, and then, a thermal treatment is performed at a temperature of 110° C. for 30 minutes using an oven, for example, to thereby form a side surface of the resist to be tapered. Thereafter, the projection portion 12 may be formed by performing the dry etching method of using a mixed gas of $BCl_3$ and $Cl_2$, for example, until the resist is removed under a predetermined condition of promoting etching in the transverse direction.

Furthermore, the projection portion 12 including the non-parallel surface 12c may be formed by dry-etching the substrate using the mask, by separating the remaining mask, and then by dry-etching the substrate 101 again. More specifically, for example, a post-baking process is performed in which the resist is formed on the substrate 101 and is patterned in the predetermined shape, and then, the thermal treatment is performed at the temperature of 110° C. for 30 minutes using an oven, for example, to thereby form a side surface of the resist to be tapered. Then, the dry etching is performed under the predetermined condition of promoting the etching in the transverse direction, and the dry etching is stopped before the resist is removed. Thereafter, the projection portion 12 may be formed by a method in which the resist is separated and the dry etching is restarted to perform a predetermined amount of etching. The projection portion 12 formed by this method has excellent height inplane uniformity.

Furthermore, in a case where the wet etching is used as the etching method, the projection portion 12 including the non-parallel surface 12c on the substrate 101 may be formed in combination with the dry etching.

For example, in a case where the substrate 101 is a sapphire single-crystal substrate, the wet etching may be performed by using acid such as mixed acid of phosphoric acid and sulfuric acid at a high temperature of 250° C. or more, for example.

As a method of combining the wet etching and the dry etching, for example, a method is used in which the substrate 101 is dry-etched until the mask is removed and then a predetermined amount of wet-etching is performed using high-temperature acid. By forming the projection portion 12 on the substrate 101 using the above-described method, it is possible to expose the crystal plane on the inclined surface which forms the side surface 12b of the projection portion 12 and to enhance reproductivity of the angle of the inclined surface of the projection portion 12. Furthermore, it is possible to expose the crystal plane made of c-plane surface 11 on the upper surface 10 of the substrate 101 with excellent reproductivity.

Furthermore, as the method of combining the wet etching and the dry etching, for example, another method other than the above-described method may be used in which a mask made of an acid-resistant material such as $SiO_2$ is formed as the mask to perform the wet etching, and then the mask is separated to perform the dry etching under the predetermined condition of promoting the etching in the transverse direction. The projection portion 12 formed in this way has excellent height inplane uniformity. Furthermore, even in a case where the projection portion 12 is formed using this method, the reproductivity of the angle of the inclined surface which forms the side surface 12b of the projection portion 12 is enhanced.

In the present embodiment, an example has been described in which the etching method for forming the projection portion 12 is used, but the invention is not limited thereto. For example, the projection portion 12 may be formed by accumulating a material which forms the projection portion 12 on the substrate 101. As a method of accumulating the material which forms the projection portion 12 on the substrate 101, a sputtering method, a deposition method, a CVD method or the like may be used. Furthermore, as the material which forms the projection portion 12, a material having approximately the same refraction index as that of the substrate 101 is preferably used, and $Al_2O_3$, SiN, $SiO_2$ or the like may be used for a substrate made of sapphire.

(Intermediate Layer Forming Process)

Next, in the present embodiment, an intermediate forming process of forming the intermediate layer 102 including MN by the plasma sputtering method performed in a nitrogen atmosphere, using Al as a target, is performed on the upper surface (main surface) 10 of the substrate 101.

In a case where the intermediate layer 102 is formed on the upper surface 10 of the substrate 101, it is preferable that a pretreatment be performed on the substrate 101 and then the intermediate layer 102 be formed.

As the pretreatment, for example, the substrate 101 may be disposed in a chamber of a sputtering apparatus and the surface of the substrate may be sputtered before the intermediate layer 102 is formed. Specifically, it is possible to perform the pretreatment of cleaning the upper surface 10 by disposing the substrate 101 in Ar or $N_2$ plasma in the chamber. By allowing the plasma such as Ar gas or $N_2$ gas to act on the upper surface 10 of the substrate 101, it is possible to remove organic substances or oxide products attached to the upper surface 10 of the substrate 101. In this case, if a voltage is applied between the substrate 101 and the chamber without applying electric power to a target, plasma particles efficiently act on the substrate 101.

After performing the pretreatment on the substrate 101, the intermediate layer 102 is formed on the substrate 101 by the plasma sputtering method. In the present embodiment, a large diameter target is used as a target, the target and the substrate 101 are closely disposed, and the intermediate layer 102 is formed under a condition satisfying a first condition that the relationship shown in expression (1) as described later is established.

Figure 5A:
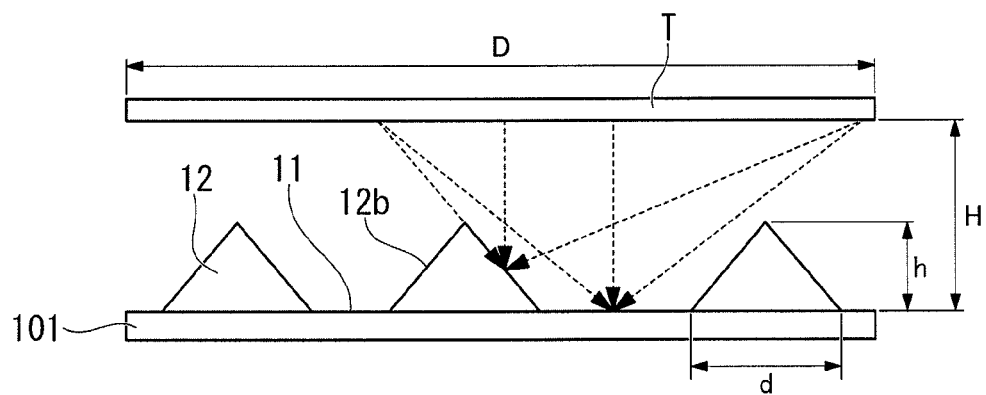
FIG. 5A is a process diagram illustrating an intermediate layer forming process which forms an intermediate layer by a plasma sputtering method.
Figure 5B:
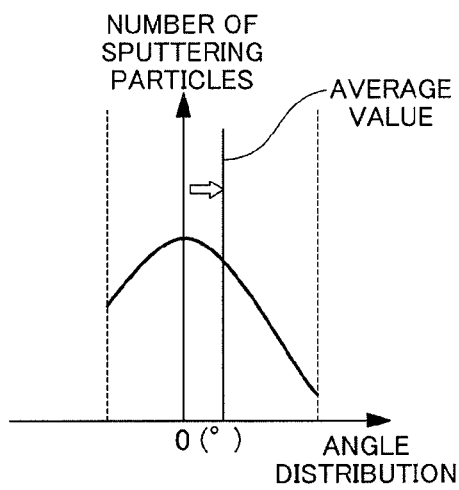
FIG. 5B is a graph illustrating the relationship between an angle distribution of sputtering particles which enter a side surface of a projection portion and the number of sputtering particles.
Figure 5C:
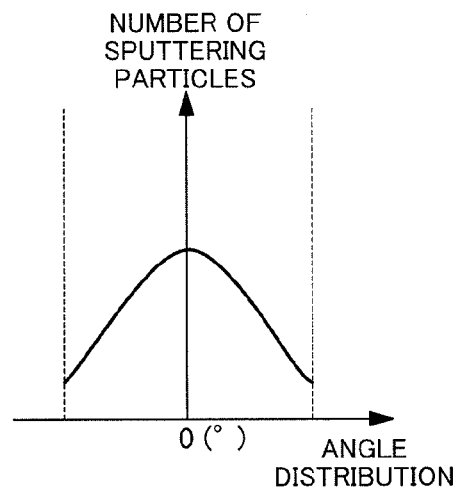
FIG. 5C is a graph illustrating the relationship between an angle distribution of sputtering particles which enter a c-plane surface and the number of sputtering particles.

FIGS. 5A to 5C are diagrams schematically illustrating a manufacturing method of the semiconductor light-emitting device according to the present embodiment. FIG. 5A is a process diagram illustrating an intermediate layer forming process which forms the intermediate layer 102 by a plasma sputtering method, FIG. 5B is a graph illustrating the relationship between an angle distribution of sputtering particles which enter the side surface 12b of the projection portion 12 and the number of sputtering particles, and FIG. 5C is a graph illustrating the relationship between an angle distribution of sputtering particles which enter the c-plane surface 11 and the number of sputtering particles. The position of an angle distribution 0° in FIGS. 5B and 5C represents an angle at which the sputtering particles orthogonally enter the c-plane surface 11 and a dotted line shown in FIG. 5B represents an angle range that the sputtering particles can enter the side surface 12b of the projection portion 12. Furthermore, a dotted line shown in FIG. 5C represents an angle range in which the sputtering particles can enter c-plane surface 11.

(First Condition)

As shown in FIG. 5A, when the height of the projection portion 12 of the substrate 101 is h, the maximum diameter of the projection portion 12 is d, the maximum diameter of the target T is D, and the distance between the target T and the c-plane surface 11 of the substrate 101 is H, the relationship of the expression (1) of D/H>d/h is established.

Furthermore, a value of D/H is preferably five or less times a value of d/h, and more preferably three or less times.

In a case where the value of D/H exceeds five times the value of d/h, the cost of the material of the target T is increased. Furthermore, in a case where the distance H between the target T and the c-plane surface 11 of the substrate 101 is large, the plasma at the time of sputtering becomes unstable, and thus, discharging may not be performed. In a case where the value of D/H exceeds five times the value of d/h, when the maximum diameter d of the projection portion 12 is small, the light diffuse reflection effect may not be sufficiently obtained. Furthermore, in a case where the height h of the projection portion 12 is large, the film thickness of the group III nitride semiconductor layer 103 for obtaining the group III nitride semiconductor layer 103 having the flat surface 103a becomes excessively thick, which causes a significant cost increase.

In the present embodiment, since the intermediate layer 102 is formed under the first condition, as shown in FIGS. 5A and 5B, the sputtering particles enter over a wide incident angle range on the side surface 12b of the projection portion 12, and an average value of the entering angles is biased on the side of the side surface 12b which faces the target T. Furthermore, as shown in FIGS. 5A and 5C, the sputtering particles enter over a wide incident angle range on the c-plane surface 11, and an average value of the entering angles becomes approximately 0°.

As a result, in the present embodiment, irrespective of the position on the substrate 101, the intermediate layer 102 is formed on the projection portion 12 with a sufficiently thick film thickness, in a similar way to the c-plane surface 11. Furthermore, a difference in the film thickness of the intermediate layer 102 on the substrate 101 is reduced, and the film thickness $t_2$ on the projection portion 12 is 60% or more of the film thickness $t_1$ on the c-plane surface 11 of the substrate 101 $((t_2/t_1)\times100 \geq 60(\%))$, so that the intermediate layer 102 including AlN having the single-crystal phase on the c-plane surface 11 and the polycrystalline phase on the projection portion B12 is formed.

Here, a case where the intermediate layer 102 is formed under a condition which does not satisfy the first condition will be described with reference to FIGS. 6A to 6C.

Figure 6A:
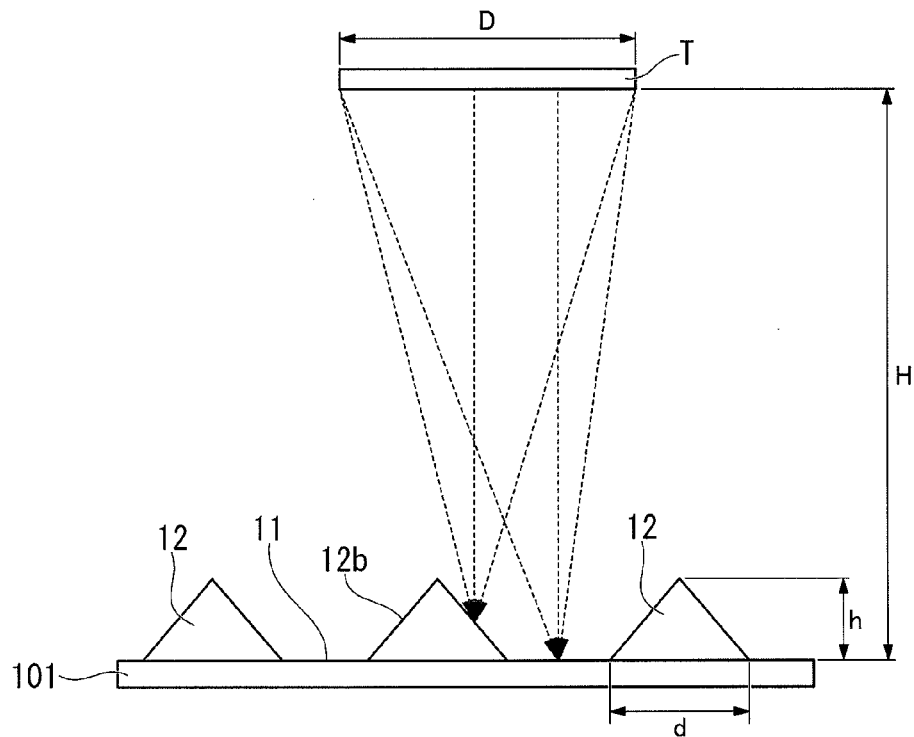
FIG. 6A is a process diagram illustrating a process of forming an intermediate layer by a plasma sputtering method.
Figure 6B:
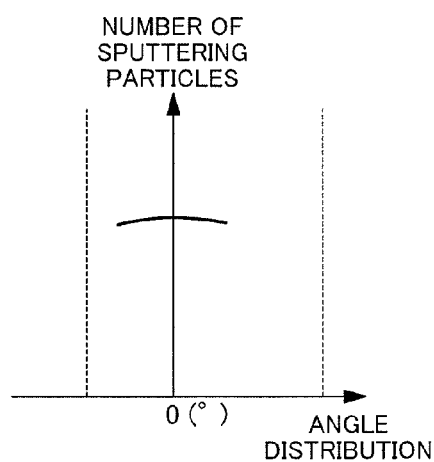
FIG. 6B is a graph illustrating the relationship between an angle distribution of sputtering particles which enter a side surface of a projection portion and the number of sputtering particles.
Figure 6C:
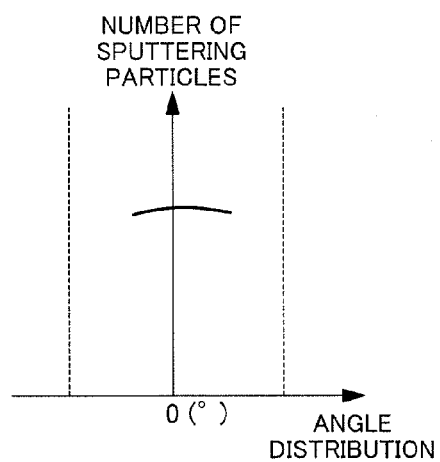
FIG. 6C is a graph illustrating the relationship between an angle distribution of sputtering particles which enter a c-plane surface and the number of sputtering particles.

FIG. 6A is a process diagram illustrating a process of forming the intermediate layer 102 by the plasma sputtering method, FIG. 6B is a graph illustrating the relationship between an angle distribution of sputtering particles which enter the side surface 12b of the projection portion 12 and the number of sputtering particles, and FIG. 6C is a graph illustrating the relationship between an angle distribution of sputtering particles which enter the c-plane surface 11 and the number of sputtering particles. The position of an angle distribution 0° in FIGS. 6B and 6C represents an angle that the sputtering particles orthogonally enter the c-plane surface 11, a dotted line shown in FIG. 6B represents an angle range in which the sputtering particles can enter the side surface 12b of the projection portion 12. Furthermore, a dotted line shown in FIG. 6C represents an angle range in which the sputtering particles can enter c-plane surface 11.

In the example shown in FIGS. 6A to 6C, since the maximum diameter D of the target T is small and the distance H between the target T and the c-plane surface 11 of the substrate 101 is large, the relationship of the expression (1) is not established, and the first condition is not satisfied.

In this way, in the example shown in FIGS. 6, since the intermediate layer 102 is formed under the condition which does not satisfy the first condition, as shown in FIG. 6A, the straightness of the sputtering particles is enhanced. Accordingly, as shown in FIGS. 6A and 6B, the sputtering particles enter at a narrow entering angle range in an enterable angle range on the side surface 12b of the projection portion 12, and an average value of the entering angles becomes approximately 0°. Furthermore, as shown in FIGS. 6A and 6C, the sputtering particles similarly enter at a narrow entering angle range in an enterable angle range on the c-plane surface 11, and an average value of the entering angles becomes approximately 0°.

Accordingly, in the example shown in FIGS. 6A to 6C, the film thickness of the intermediate layer 102 becomes thin on the side surface 12b of the projection portion 12, compared with the c-plane surface 11, and the film thickness $t_2$ on the projection portion 12 does not reach 60% or more of the film thickness $t_1$ on the c-plane surface 11 of the substrate 101 $((t_2/t_1) \times 100 < 60(\%))$, and the intermediate layer 102 including AlN having the polycrystalline phase on the projection portion 12 is not formed.

Furthermore, in the example shown in FIGS. 6A to 6C, the thickness of the intermediate layer 102 on the projection portion 12 which is positioned on the outermost side of the substrate 101 is relatively thin compared with the thickness of the intermediate layer 102 on the projection portion 12 which is positioned at the center of the substrate 101, and a difference in the film thickness of the intermediate layer 102 on the substrate 101 becomes large.

Furthermore, as the sputtering apparatus of forming the intermediate layer 102, it is preferable to use a sputtering apparatus including a mechanism which is provided with a high-frequency power source and is capable of moving the position of the magnet in the target. Furthermore, when the intermediate layer 102 is formed, it is preferable that the c-plane surface 11 of the substrate 101 be disposed in plasma to form the intermediate layer 102.

Figure 7:
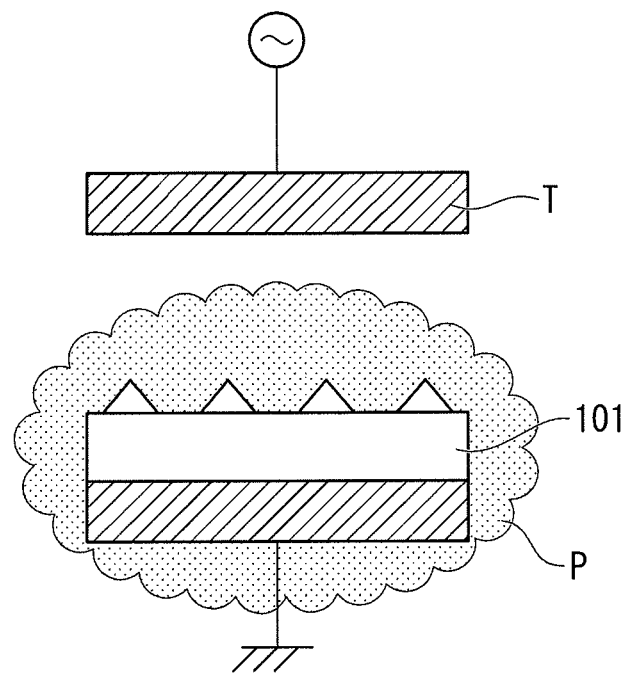
FIG. 7 is a process diagram illustrating an example of a method of arranging a c-plane surface of a substrate in plasma and forming an intermediate layer.

FIG. 7 is a process diagram illustrating an example of the method of forming the intermediate layer 102 by disposing the c-plane surface 11 of the substrate 101 in plasma. As the method of forming the intermediate layer 102 by disposing the c-plane surface 11 of the substrate 101 in the plasma, there is no particular limitation. For example, as shown in FIG. 7, a method of applying a bias voltage to the target T, grounding (earthing) the substrate side, and disposing the c-plane surface 11 of the substrate 101 in plasma may be used, or a method of applying a bias voltage to the target T, the substrate 101 is electrically floated from the bias voltage, and disposing the c-plane surface 11 of the substrate 101 in plasma P, a method of applying a bias voltage to the substrate 101 side, or the like may be used.

In the present embodiment, in a case where the c-plane surface 11 of the substrate 101 is disposed in the plasma to form the intermediate layer 102, the straightness of the sputtering particles may be reduced to increase inclined components of the sputtering particles, so that the intermediate layer 102 may be easily formed on the side surface 12b of the projection portion 12 to easily form the polycrystalline phase on the projection portion 12. Consequently, the intermediate layer 102 is formed on the projection portion 12 with a sufficient thick film thickness, and the film thickness $t_2$ on the projection portion 12 becomes 60% or more of the film thickness $t_1$ on the c-plane surface 11 of the substrate 101 $((t_2/t_1) \times 100 \geq 60(\%))$. Furthermore, the intermediate layer 102 including AlN having the single-crystal phase on the c-plane surface 11 and the polycrystalline phase on the projection portion 12 is easily formed.

The intermediate layer 102 may be formed by the MOCVD method instead of the above-described sputtering method. However, if the intermediate layer is formed by the MOCVD method, since the projection portion 12 is formed on the upper surface 10 of the substrate 101, the flow of the raw material gas is disturbed on the upper surface 10. Thus, the thickness of the intermediate layer 102 formed on the c-plane surface of the substrate 101 by the MOCVD method deteriorates in uniformity. Furthermore, the intermediate layer 102 is hardly formed on the projection portion 12. On the other hand, in the sputtering method, since the raw material particles have a high straightness, it is possible to set the ratio of the thickness of the intermediate layer 102 on the c-plane surface 11 and the thickness of the intermediate layer 102 on the projection portion 12 in a preferable range, without being influenced by the shape of the upper surface 10. Accordingly, the intermediate layer 102 is formed by the sputtering method.

[Epitaxial Process]

Next, an LED structure forming process of forming the LED structure 20 including the group III nitride semiconductor is performed on the intermediate layer 102. In the present embodiment, after the intermediate layer forming process and before performing the LED structure forming process, an epitaxial process of covering the projection portion 12 with the group III nitride semiconductor layer 103 by epitaxially growing the single-crystal group III nitride semiconductor layer 103 which includes a composition of $Al_xGa_yN_{1-x-y}$ ($0 \leq x \leq 1$, $0 \leq y \leq 1$, $x+y=1$) on the upper surface 10 of the substrate 101 on which the intermediate layer 102 is formed, is performed.

For example, in a case where the single-crystal group III nitride semiconductor layer 103 is epitaxially grown directly (or through the intermediate layer 102) on the surface of the sapphire substrate, the single-crystal layer oriented in the C axial direction can be easily grown epitaxially from the c-plane surface (or the single-crystal phase of the intermediate layer 102), and there is a tendency for epitaxial growth of the single-crystal layer on a different surface (from the projection portion 12) to be difficult. Furthermore, if the single-crystal group III nitride semiconductor layer 103 is grown directly (or through the intermediate layer 102) on the surface of the sapphire substrate using the MOCVD method, the single-crystal layer is epitaxially grown from the c-plane surface (or the single-crystal phase of the intermediate layer 102), but the single-crystal layer is not epitaxially grown on the surface other than the c-plane surface (or the single-crystalline phase of the intermediate layer 102). Thus, it is preferable that the group III nitride semiconductor layer 103 be grown by the MOCVD method.

In the present embodiment, when the group III nitride semiconductor layer 103 is epitaxially grown by the MOCVD method on the upper surface 10 of the substrate 101 in which the intermediate layer 102 is formed, crystals are not grown from the polycrystalline phase of the intermediate layer 102 formed on the surface 12c of the projection portion 12 including the surface 12c which is not parallel with the c-plane surface 11 of the substrate 101, and the single-crystal layer oriented in the C axial direction is epitaxially grown only from the single-crystal phase of the intermediate layer 102 formed on the (0001) c-plane surface 11 of the substrate 101.

Furthermore, in a case where the group III nitride semiconductor layer 103 is epitaxially grown by the MOCVD method on the upper surface 10 of the substrate 101 in which the projection portion 12 is formed, it is preferable to use the following growth condition for obtaining sufficient surface flatness or excellent crystallinity.

(Growth Condition)

In a case where the group III nitride semiconductor layer 103 is epitaxially grown by the MOCVD method on the upper surface 10 of the substrate 101 in which projection portion 12 is formed, it is preferable to set growth pressure and growth temperature in the following growth condition. If the growth pressure is low and the growth temperature is high, crystal growth in the transverse direction is promoted, and if the growth pressure is high and the growth temperature is low, a facet growth mode (A shape) is obtained.

Furthermore, if the growth pressure in initial growth is high, full width at half maximum of an X-ray rocking curve (XRC-FWHM) becomes small, which tends to improve crystallinity.

Accordingly, in a case where the group III nitride semiconductor layer 103 is epitaxially grown by the MOCVD method on the upper surface 10 of the substrate 101 in which the projection portion 12 is formed, it is preferable that the growth pressure be changed at two stages, that is, before the film thickness of the group III nitride semiconductor layer 103 becomes about 2 μm or more (first half) and after the film thickness of the group III nitride semiconductor layer 103 becomes about 2 μm or more (second half).

In the first half, the growth pressure is preferably 40 kPa or more, and more preferably about 60 kPa. If the growth pressure is 40 kPa or more, the facet growth mode (Δ shape) is obtained, and dislocation is bent in the transverse direction, and thus does not penetrate into the epitaxially grown surface. Thus, if the growth pressure is increased, it is inferred that the dislocation is lowered to improve crystallinity. Furthermore, if the growth pressure is smaller than 40 kPa, the crystallinity deteriorates to increase the full width at half maximum of the X-ray rocking curve (XRC-FWHM), which is not preferable.

However, if the growth pressure is 40 kPa or more, pits tend to occur on the surface of the group III nitride semiconductor layer 103 which is epitaxially grown, and thus, a sufficient surface flatness may not be obtained. Thus, if the growth pressure is 40 kPa or more, the growth temperature is preferably 1,140° C. or less, and is more preferably about 1,120° C. By setting the growth temperature to 1,140° C. or less, even in a case where the growth pressure is 40 kPa or more, preferably about 60 kPa, it is possible to sufficiently suppress pit occurrence.

Furthermore, in the second half, the growth pressure is preferably 40 kPa or less, and more preferably about 20 kPa. By setting the growth pressure to 40 kPa or less in the second half, it is possible to promote crystal growth in the transverse direction and to obtain the group III nitride semiconductor layer 103 with excellent surface flatness. The stacked structure shown in FIG. 2 is obtained through the above process.

Next, the LED structure forming process of forming the LED structure 20 including the group III nitride semiconductor layer 103 on the intermediate layer 102 on which the group III nitride semiconductor layer 103 is formed, is performed. The LED structure forming process may be performed by methods well-known in this technical field.

Thereafter, the light-transmissive positive electrode 109, the positive electrode bonding pad 107, and the negative electrode bonding pad 108 are installed using the well-known methods in this technical field, to thereby obtain the light-emitting device 1 shown in FIG. 1.

The light-emitting device 1 according to the present embodiment includes the substrate 101 on which the plurality of projection portions 12 is formed on the upper surface 10 including the c-plane surface 11; the intermediate layer 102 which is formed to cover the main surface 10 of the substrate 101, in which the film thickness $t_2$ on the projection portion 12 is 60% or more of the film thickness $t_1$ on the c-plane surface 11 of the substrate 101 $((t_2/t_1)\times100\geq60(\%))$, and which includes AlN having the single-crystal phase on the c-plane surface 11 and the polycrystalline phase on the projection portion 12; and the LED structure 20 including the group III nitride semiconductor stacked on the intermediate layer 102. Thus, the LED structure 20 stacked on the intermediate layer 102 has excellent crystallinity. Accordingly, the light-emitting device 1 according to the present embodiment may form a lamp having a small output decrease in a high temperature environment.

Furthermore, since the light-emitting device 1 according to the present embodiment includes the projection portion 12 on the substrate 101, it is possible to obtain excellent light extraction efficiency by light diffuse reflection on the interface on the side of the intermediate layer 102 of the substrate 101.

Furthermore, the manufacturing method of the light-emitting device 1 according to the present embodiment includes the process of forming the plurality of projection portions 12 on the upper surface 10 including the c-plane surface 11 of the substrate 101; the intermediate layer forming process of forming the intermediate layer 102 including AlN by the plasma sputtering method using Al as the target on the upper surface 10 of the substrate 101; and the process of forming the LED structure 20 including the group III nitride semiconductor on the intermediate layer 102. Furthermore, in the intermediate layer forming process, when the height of the projection portion 12 is h, the maximum diameter of the projection portion 12 is d, the maximum diameter of the target is D, and the distance between the target and the c-plane surface 11 of the substrate 101 is H, the intermediate layer 102 is formed under the condition where the relationship of D/H>d/h is established. Thus, the intermediate layer 102 which is formed to cover the main surface 10 of the substrate 101 and includes AlN having the single-crystal phase on the c-plane surface 11 and the polycrystalline phase on the projection portion 12 where the film thickness $t_2$ on the projection portion 12 is 60% or more $((t_2/t_1)\times100\geq60(\%))$ of the film thickness $t_1$ on the c-plane surface 11 of the substrate 101, is provided, to thereby obtain the light-emitting device 1 having the LED structure 20 of excellent crystallinity.

Furthermore, in the manufacturing method of the present embodiment, since the epitaxial process of growing the group III nitride semiconductor layer 103 which covers the projection portions 12 on the intermediate layer 102 is provided between the intermediate layer forming process and the process of forming the LED structure 20, the crystalline defect such as dislocation hardly occurs in the crystals of the group III nitride semiconductor which forms the LED structure 20, to thereby obtain the LED structure 20 with excellent crystallinity.

(Lamp)

A lamp 3 according to the present invention includes the semiconductor light-emitting device according to the present invention. The lamp 3 according to the present invention is obtained by combining the semiconductor light-emitting device according to the present invention and a phosphor, for example. The lamp obtained by combining the semiconductor light-emitting device according to the present invention and the phosphor may have a configuration known by those skilled in this technical field by means known by those skilled in this technical field.

Figure 8:
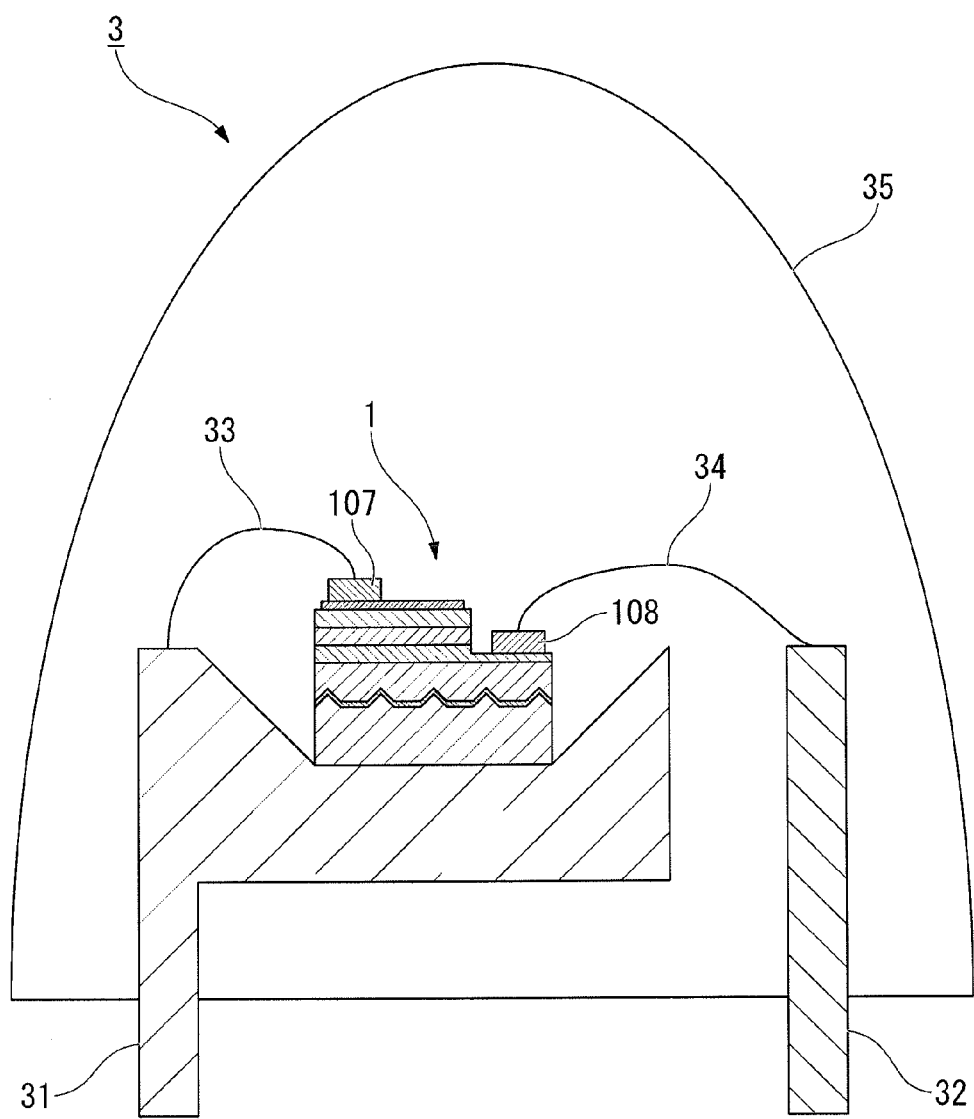
FIG. 8 is a diagram schematically illustrating an example of a lamp according to the present embodiment.

FIG. 8 is a diagram schematically illustrating an example of the lamp according to the present embodiment. The lamp 3 shown in FIG. 8 has a bullet shape, and is provided with the light-emitting device 1 shown in FIG. 1. In the lamp 3 shown in FIG. 8, the positive electrode bonding pad 107 of the light-emitting device 1 is bonded with one (frame 31 in FIG. 8) of two frames 31 and 32 through a wire 33, and the negative electrode bonding pad 108 of the light-emitting device 1 is bonded with the other frame 32 through a wire 34, and thus, the light-emitting device 1 is mounted therein. Furthermore, as shown in FIG. 8, the periphery around the light-emitting device 1 is encapsulated with a mold 35 made of a transparent resin.

TABLE 1

|  | Base width d (μm) | Height h (μm) | Base width/4 (μm) | Interval between adjacent projection portions (μm) |
|---|---|---|---|---|
| Example 1 | 1.2 | 0.6 | 0.3 | 0.5 |
| Example 2 | 1.5 | 0.6 | 0.4 | 0.5 |
| Example 3 | 2.5 | 0.8 | 0.6 | 1.5 |
| Example 4 | 1.5 | 0.4 | 0.4 | 0.2 |
| Example 5 | 1.5 | 0.6 | 0.4 | 0.5 |
| Comparative Example 1 | 1.5 | 0.6 | 0.4 | 0.5 |
| Comparative Example 2 | 1.5 | 0.6 | 0.4 | 0.5 |

TABLE 2

|  | Maximum diameter of target D (mm) | Distance between target and c-plane surface of substrate H (mm) | D/H | d/h | Shape of projection portion | Crystal phase on c-plane surface | Crystal phase on projection portion | Film thickness on c-plane surface t1 (nm) | Film thickness on projection portion t2 (nm) | (t2/t1) × 100 (%) |
|---|---|---|---|---|---|---|---|---|---|---|
| Example 1 | 237 | 60 | 4.0 | 2.0 | Approximate hemisphere | Single crystal phase | Polycrystalline Phase | 20 | 12.5 | 62.5 |
| Example 2 | 237 | 80 | 3.0 | 2.5 | Approximate hemisphere | Single crystal phase | Polycrystalline Phase | 23 | 15 | 65 |
| Example 3 | 237 | 60 | 4.0 | 3.1 | Approximate cone | Single crystal phase | Polycrystalline Phase | 22 | 15 | 68 |
| Example 4 | 237 | 60 | 4.0 | 3.8 | Approximate cone | Single crystal phase | Polycrystalline Phase | 20 | 12 | 60 |
| Example 5 | 360 | 60 | 6.0 | 2.5 | Approximate hemisphere | Single crystal phase | Polycrystalline Phase | 20 | 16 | 80 |
| Comparative Example 1 | 168 | 80 | 2.1 | 2.5 | Approximate hemisphere | Polycrystalline phase | Polycrystalline Phase | 20 | 10 | 50 |
| Comparative Example 2 | 237 | 120 | 2.0 | 2.5 | Approximate hemisphere | Polycrystalline phase | Polycrystalline Phase | 30 | 15 | 50 |

Since the lamp 3 according to the present embodiment is provided with the light-emitting device 1 according to the present invention, an output decrease is small in a high temperature environment, to thereby obtain excellent light emission characteristics.

The lamp according to the present invention is not limited to the lamp 3 of the bullet shape shown in FIG. 8, and for example, a side view lamp used for a portable backlight or the like, a top view lamp used for an indicator or the like may be used.

Next, the present invention will be described in more detail with reference to Examples and Comparative Examples, but is not limited thereto.

Example 1

The plurality of projection portions having the "base width", "height", "base width/4", and "interval between adjacent projection portions" shown in Table 1 and the shape shown in Table 2 was formed on the (0001) c-plane surface of a sapphire substrate having a diameter of 100 mm (diameter of 4 inches) as follows (substrate processing process). Here, a mask was formed using known photolithography on the c-plane surface of sapphire substrate of the diameter of 4 inches, the sapphire substrate was etched using dry etching, to thereby form the projection portions. As an exposure method, a stepper exposure method using ultraviolet light was used. Furthermore, a mixed gas of $BCl_3$ and $Cl_2$ was used for the dry etching.

Next, the substrate on which the plurality of projection portions was formed was placed in a chamber of a sputtering apparatus which forms the intermediate layer, and was heated at 600° C., and nitrogen gas was introduced at a flow rate of 100 sccm in the chamber, the pressure in the chamber was maintained at 0.7 Pa, and the substrate was then disposed in the nitrogen plasma, to thereby clean the surface of the substrate (pretreatment).

Thereafter, the intermediate layer including AlN using the plasma sputtering method using Al as a target was formed on the upper surface of the substrate on which the plurality of projection portions was formed (intermediate layer forming process). As the sputtering apparatus which forms the intermediate layer 102, a sputtering apparatus including a mechanism which is provided with a high-frequency power source and is capable of moving the position of the magnet in the target was used. Furthermore, the intermediate layer was formed by a method of applying electric power to the target T, grounding (earth) bias, and disposing the c-plane surface 11 of the substrate 101 in plasma, as shown in FIG. 7.

More specifically, under the condition that argon gas and nitrogen gas were introduced in the chamber of the sputtering apparatus, the temperature of the substrate was maintained as the temperature at the time of the pretreatment, a high frequency bias of 2,000 W was applied to the side of the target of metal Al, the pressure in the chamber was maintained at 1 Pa, and the Ar gas of 25 sccm and the nitrogen gas of 75 sccm was flowed (the ratio of nitrogen to the entire gas is 75%), the intermediate layer including AlN was formed on the substrate on which the plurality of projection portions was formed. The growth rate was 0.08 nm/s. The magnet in the target was rotated at the time of the pretreatment and the intermediate layer formation.

Furthermore, the intermediate layer was formed under the condition which satisfies the first condition shown in Table 1, Table 2 and the following description.

(First Condition)

As shown in FIG. 5A, when the height h of the projection portion 12 of the substrate was 0.6 μm, the maximum diameter d (base width) of the projection portion 12 was 1.2 μm, the maximum diameter D of the target T was 237 mm, and the distance H between the target T and the c-plane surface 11 of the substrate 101 was 60 mm, the relationship of the expression (1) of D/H>d/h was established.

As shown in Table 2, in the intermediate layer obtained in this way, the film thickness $t_1$ on the c-plane surface was 20 nm, the film thickness $t_2$ on the projection portion was 12.5 nm, and the film thickness on the projection portion was 62.5% of the film thickness on the c-plane surface. Furthermore, as shown in Table 2, the intermediate layer had the single-crystal phase on the c-plane surface and the polycrystalline phase on the projection portion. It was confirmed, using an image obtained by photographing the intermediate layer using the transmission electron microscope (TEM), that the crystal phase on the c-plane surface and the projection portion of the intermediate layer was the single-crystal phase or the polycrystalline phase.

Next, the group III nitride semiconductor layer was epitaxially grown on the intermediate layer, using the following decompression MOCVD method (epitaxial process).

Firstly, the substrate on which the intermediate layer was formed, extracted from the sputtering apparatus, was introduced into a reaction furnace for the growth of the group III nitride semiconductor layer by the MOCVD method. Thereafter, the temperature of the substrate was increased to 1,120° C., and the pressure in the reacting furnace was maintained at 60 kPa. After confirming that the temperature of the substrate was stabilized at 1,120° C., trimethylgallium (TMG) started to be supplied to the vapor deposition reacting furnace, and the group III nitride semiconductor layer including an undoped GaN layer was epitaxially grown on the intermediate layer up to the film thickness of about 2 μm or more (first half).

Subsequently, the pressure in the reacting furnace was maintained at 20 kPa, and the group III nitride semiconductor layer including the undoped GaN layer was epitaxially grown on the intermediate layer up to the film thickness of 3 μm (second half).

The amount of ammonia when the group III nitride semiconductor layer was grown was adjusted so that the ratio of group V (N) to group III (Ga) was 600.

Next, the respective layers of the n-type semiconductor layer, the light-emitting layer, the p-type semiconductor layer for forming the LED structure including the group III nitride semiconductor layer were stacked on the group III nitride semiconductor layer by the following method (LED structure forming apparatus).

(N-Type Semiconductor Layer)

As the n-type semiconductor layer, the n-type contact layer and the n-type cladding layer were formed. Firstly, the amount of ammonia was adjusted so that the ratio of group V (N) to group III (Ga) was 600, an undoped GaN layer of 1 μm was grown on the group III nitride semiconductor layer, and the n-type contact layer including an n-type GaN layer of 2 μm using monosilane ($SiH_4$) gas which is a dopant gas was then formed under the same conditions. The doping amount of Si was $5 \times 10^{18}/cm^3$. After growth of the n-type contact layer, the supply of TMG into the reacting furnace was stopped by closing a valve of TMG.

After growth of the n-contact layer, carrier gas was changed from all hydrogen gas to all nitrogen gas while flowing ammonia as it was. Then, the temperature of the substrate was reduced from 1,100° C. to 760° C., and the supply amount of $SiH_4$ was then set. The amount of $SiH_4$ flowing into the reacting furnace was adjusted so that the electron concentration of the Si-doped GaInN cladding layer was $1 \times 10^{18}$ cm$^{-3}$.

Thereafter, valves of TMI, TEG and $SiH_4$ was simultaneously switched so that these raw materials started to be supplied to the reacting furnace, and the n-type cladding layer including Si-doped $Ga_{0.99}In_{0.01}N$ having a film thickness of 20 nm was formed.

(Light-Emitting Layer)

The light-emitting layer having a multiple quantum well structure including a barrier layer and a well layer was formed. Firstly, the supply amount of $SiH_4$ into the reacting furnace was adjusted so that the electron concentration of a barrier layer including a Si-doped GaN layer was $3 \times 10^{17}$ cm$^{-3}$. Furthermore, the temperature of the substrate was set to 750° C., TEG and $SiH_4$ started to be supplied to the reacting furnace, and thus, a thin barrier layer A including a Si-doped GaN layer was formed. Then, the supply of TEG and $SiH_4$ was stopped.

Thereafter, the temperature of a susceptor was increased to 920° C., TEG and $SiH_4$ started to be supplied to the reacting furnace, and thus, a barrier layer B including a Si-doped GaN layer was formed at a substrate temperature of 930° C.

Subsequently, the temperature of the susceptor was decreased to 750° C., TEG and $SiH_4$ started to be supplied to the reacting furnace, and thus, a barrier layer C including a Si-doped GaN layer was grown. Then, the supply of TEG and $SiH_4$ to the reacting furnace was stopped to complete the growth of the barrier layer C. Thus, the barrier layer, including the Si-doped GaN layer of the total film thickness of 20 nm, of the three layer structure including the barrier layer A, the barrier layer B and the barrier layer C was formed.

After completion of the growth of the barrier layer, the supply of TEG and TMI to the reacting furnace was performed while maintaining the substrate temperature or the pressure in the reacting furnace, the flow rates or types of the ammonia gas and the carrier gas as they were, and a well layer of $Ga_{0.93}In_{0.07}N$ which had the film thickness of 3 nm was grown.

By repeating the above-described process five times, a barrier layer including five layers of Si-doped GaN and a well layer having five layers of $Ga_{0.93}In_{0.07}N$ were formed. Furthermore, after formation of the fifth well layer, a sixth barrier layer was formed.

Through the above-described procedure, the light-emitting layer of the multiple quantum well structure including the barrier layer and the well layer was formed.

(P-Type Semiconductor Layer)

The p-type semiconductor layer including the p-type cladding layer and the p-type contact layer was formed on the light-emitting layer which was completed by the barrier layer of Si-doped GaN obtained in this way.

Firstly, a p-type cladding layer including Mg-doped $Al_{0.08}Ga_{0.92}N$ was formed on the light-emitting layer. The temperature of the substrate was increased to 1,050° C., hydrogen was used as the carrier gas, the pressure of the reacting furnace was maintained at 15 kPa, and TMG, TMA and $Cp_2Mg$ started to be supplied to the reacting furnace, so that the p-type cladding layer including Mg-doped $Al_{0.08}Ga_{0.92}N$ with a film thickness of 12 nm was formed.

Subsequently, the p-type contact layer was formed on the p-type cladding layer. That is, after completion of the growth of the p-type cladding layer, TMG, TMA and $Cp_2Mg$ was supplied to the reacting furnace, and thus, the p-type contact layer of p-type $Al_{0.02}Ga_{0.98}N$ which is Mg-doped having the film thickness of 0.2 μm was formed so that the hole concentration thereof was $8\times10^{17}$ cm$^{-3}$. The p-type contact layer showed the p-type even though an annealing process for activating the p-type carriers was not performed.

The light-emitting device was fabricated as follows using the substrate on which the respective layers which form the LED structure obtained in this way are formed.

Firstly, a light-transmissive positive electrode including ITO was formed on the p-type contact layer of the substrate on which the respective layers which form the LED structure were formed by the known photolithography, and a positive electrode bonding pad having a structure obtained by sequentially stacking titanium, aluminum and gold on the light-transmissive positive electrode was formed.

Subsequently, the substrate on which the positive electrode bonding pad was formed was dry-etched, a portion of the n-type semiconductor layer where the negative electrode bonding pad was formed was exposed, and a negative electrode bonding pad including four layers of Ni, Al, Ti and Au was fabricated on the exposed n-type semiconductor layer.

Next, the back surface of the substrate where the positive electrode bonding pad and the negative electrode bonding pad were formed in this way was ground and polished to form a mirror-like surface. Then, the substrate was cut into a square chip of 350 μm, to thereby form the light-emitting device.

Subsequently, the light-emitting device obtained in this way was mounted on the lead frame so that the positive electrode bonding pad and the negative electrode bonding pad faced upwards, and was connected to a lead frame through a gold wire.

Then, the light emission output at room temperature (25° C.) and at a temperature of 120° C. was measured with respect to the light-emitting device connected to the lead frame, the ratio of the light emission output at 120° C. to the light emission output at the room temperature ((light emission output at 120° C./light emission output at room temperature)$_x$ 100=(%)) was calculated, and then, the output decrease (temperature characteristics) in a high temperature environment was evaluated. The result is shown in Table 3.

TABLE 3

| | Light emission characteristics |
|---|---|
| Example 1 | 98% |
| Example 2 | 95% |
| Example 3 | 94% |
| Example 4 | 97% |
| Example 5 | 96% |
| Comparative Example 1 | 85% |
| Comparative Example 2 | 88% |

Example 2 to Example 4

Light-emitting devices of Examples 2 to 4 were formed in the same manner as in Example 1 except that the plurality of projection portions having the "base width", "height", "base width/4", and "interval between adjacent projection portions" shown in Table 1 and the shape shown in Table 2 was formed on the (0001) c-plane surface of the sapphire substrate, and the light emission characteristics (temperature characteristics) were evaluated in the same way as in Example 1. The result is shown in Table 3.

Furthermore, the film thickness on the projection portion of the intermediate layer and the film thickness on the c-plane surface, whether the crystal phase on the c-plane surface and the projection portion is the single-crystal phase or the polycrystalline phase are shown in Table 2.

Example 5

Comparative Example 1 and Comparative Example 2

Light-emitting devices of Example 5 and Comparative Examples 1 and 2 were formed in the same manner as in Example 1 except that the plurality of projection portions having the "base width", "height", "base width/4", and "interval between adjacent projection portions" shown in Table 1 and the shape shown in Table 2 was formed on the (0001) c-plane surface of the sapphire substrate and the intermediate layer was formed under the condition shown in Table 2, and the light emission characteristics were evaluated in the same way as in Example 1. The result is shown in Table 3.

Furthermore, the film thickness on the projection portion of the intermediate layer and the film thickness of the c-plane surface, whether the crystal phase on the c-plane surface and the projection portion is the single-crystal phase or the polycrystalline phase is shown in Table 2.

As shown in Table 2, in the light-emitting devices of Examples 1 to 5, the film thickness $t_2$ on the projection portion became 60% or more of the film thickness $t_1$ on the c-plane surface of the intermediate layer, and the intermediate layer included AlN having the single-crystal phase on the c-plane surface and the polycrystalline phase on the projection portion. Furthermore, as shown in Table 3, in the light-emitting devices of Examples 1 to 5, the output decrease was lowered in a high temperature environment.

On the other hand, the light-emitting devices of Comparative Examples 1 and 2 had a significant output decrease in a high temperature environment, compared with the light-emitting device of Examples 1 to 5. It is inferred that this is because the intermediate layer which formed the light-emitting devices of Comparative Examples 1 and 2 had the film thickness $t_2$ on the projection portion which is not 60% or more of the film thickness $t_1$ on the c-plane surface and crystals which are not the single-crystal phase were included in the crystal phase on the c-plane surface.

Furthermore, the light emission output at a temperature of 60° C., 80° C. and 120° C. was measured with respect to the light-emitting devices of Examples 1 to 5 and Comparative Examples 1 and 2, the ratios (output ratios) of the light emission outputs at 60° C., 80° C. and 120° C. to the light emission output at the room temperature ((light emission outputs at 60° C., 80° C. and 120° C./light emission output at room temperature)×100=(%)) were calculated, and then, the output decrease (temperature characteristics) in a high temperature environment was evaluated. The result is shown in FIG. 9.

Figure 9:
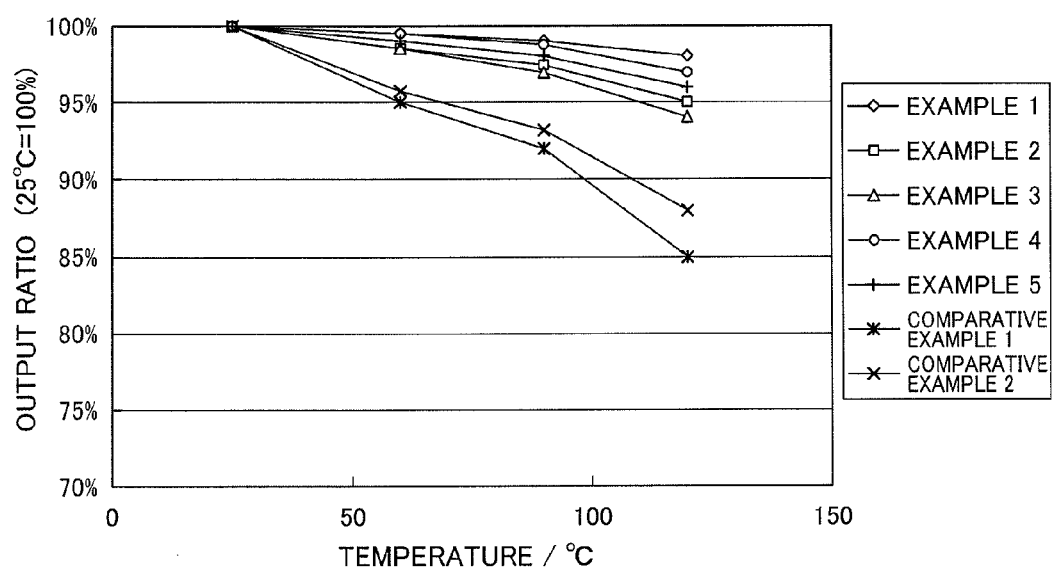
FIG. 9 is a graph illustrating the relationship between temperature and light-emitting output (output ratio) in light-emitting devices of Example 1 to Example 5, and Comparative Example 1 and Comparative Example 2.

FIG. 9 is a graph illustrating the relationship between temperatures and light-emitting outputs (output ratios) in the light-emitting devices of Examples 1 to 5, and Comparative Examples 1 and 2.

As shown in FIG. 9, the light-emitting devices of Comparative Examples 1 and 2 had a significant output decrease in a high temperature environment, compared with the light-emitting devices of Examples 1 to 5.

Figure 10:
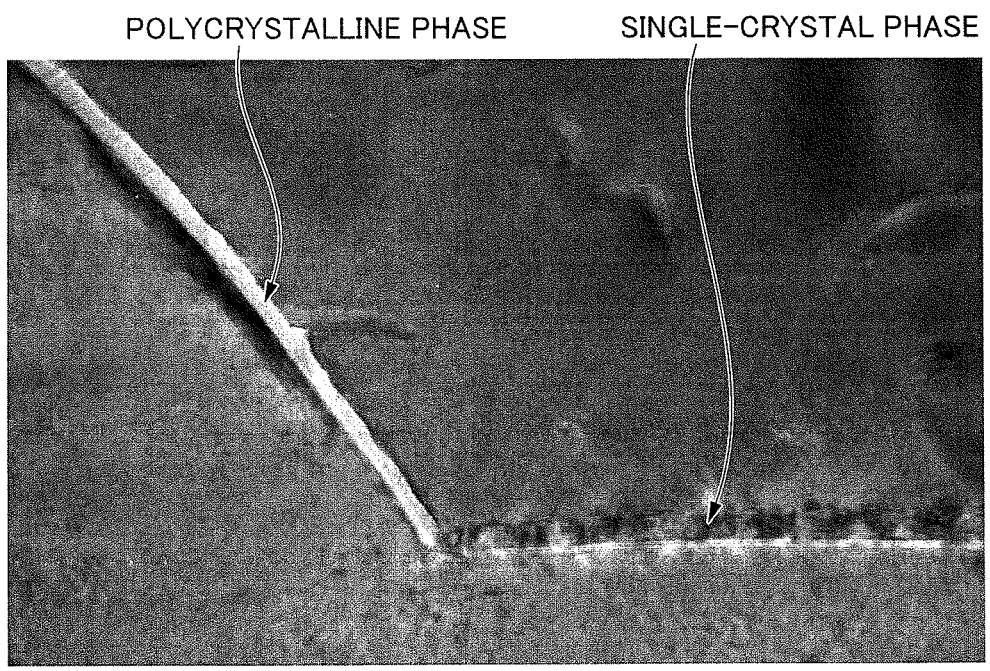
FIG. 10 is an image obtained by photographing an intermediate layer which forms Example 1 using a transmission electron microscope (TEM).
Figure 11:
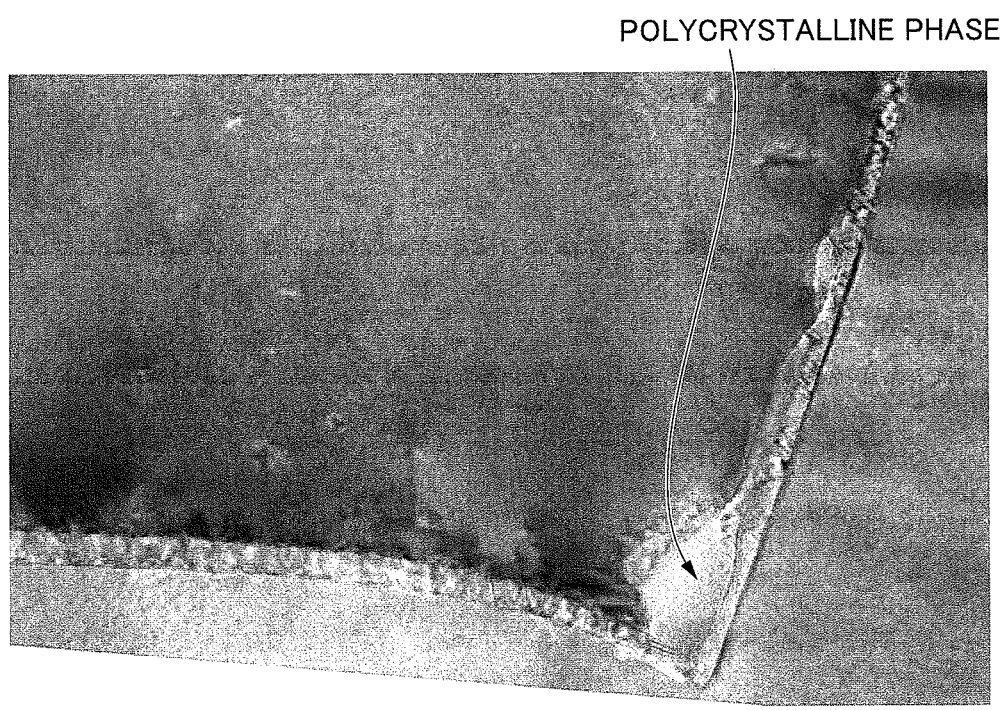
FIG. 11 is an image obtained by photographing an intermediate layer which forms Comparative Example 1 using a transmission electron microscope (TEM).

Furthermore, FIG. 10 is an image obtained by photographing an intermediate layer which forms Example 1 using a transmission electron microscope (TEM). FIG. 11 is an image obtained by photographing an intermediate layer which forms Comparative Example 1 using a transmission electron microscope (TEM).

As shown in FIG. 10, in the intermediate layer which forms the light-emitting device in Example 1, the atomic arrangement having the single-crystal phase on the c-plane surface and the polycrystalline phase on the projection portion (inclined surface of the projection portion) was observed in the TEM image. Furthermore, in the intermediate layer around the top of the projection portion in Example 1, the atomic arrangement having the amorphous phase in addition to the polycrystalline phase was observed.

Furthermore, as shown in FIG. 11, in the intermediate layer which forms the light-emitting device of Comparative Example 1, the atomic arrangement having the polycrystalline phase on the c-plane surface and on the projection portion was observed in the TEM image.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

| [Reference Signs List] | |
|---|---|
| 1: | SEMICONDUCTOR LIGHT-EMITTING DEVICE (LIGHT-EMITTING DEVICE) |
| 10: | UPPER SURFACE (MAIN SURFACE) |
| 11: | c-PLANE SURFACE |
| 12: | PROJECTION PORTION |
| 12c: | SURFACE |
| 20: | LED STRUCTURE (SEMICONDUCTOR LAYER) |
| 101: | SUBSTRATE (SINGLE-CRYSTAL SUBSTRATE) |
| 102: | INTERMEDIATE LAYER (BUFFER LAYER) |
| 103: | GROUP III NITRIDE SEMICONDUCTOR LAYER |
| 104: | n-TYPE SEMICONDUCTOR LAYER |
| 105: | LIGHT-EMITTING LAYER |
| 106: | p-TYPE SEMICONDUCTOR LAYER |
| 107: | POSITIVE ELECTRODE BONDING PAD |
| 108: | NEGATIVE ELECTRODE BONDING PAD |
| 3: | LAMP |

What is claimed is:

1. A semiconductor light-emitting device comprising: a single-crystal substrate, substrate having a c-plane main surface and a plurality of projection portions which are formed on the c-plane main surface of the single-crystal substrate
   an intermediate layer which is formed to cover the main surface of the single-crystal substrate and comprises AlN having a single-crystal phase on the c-plane surface and a polycrystalline phase on the projection portion wherein a film thickness t2 on the projection portion is smaller than a film thickness t1 on the c-plane surface, and the film thickness t2 on the projection portion is 60% or more of the film thickness t1 on the c-plane surface; and
   a semiconductor layer which is formed on the intermediate layer and which comprises a group III nitride semiconductor.

2. The device according to claim 1, wherein the single-crystal phase is continuously formed on the c-plane surface.

3. The device according to claim 1, wherein the intermediate layer on the projection portion comprises an amorphous phase.

4. The device according to claim 1,
   wherein the projection portion has a base width of 0.05 to 5 μm and a height of 0.05 to 5μm, the height is ¼ or more of the base width, and an interval between the adjacent projection portions is 0.5 to 5 times the base width.

5. The device according to claim 1, wherein a group III nitride semiconductor layer is formed between the intermediate layer and the semiconductor layer and the group III nitride semiconductor layer comprises a composition of $Al_xGa_yIn_zN(0\leq x\leq 1, 0\leq y\leq 1, 0\leq z\leq 1, x+y+z=1)$.

6. A lamp comprising the semiconductor light-emitting device according to claim 1.

7. Wherein when the height of the projection portion is h, the maximum diameter of the projection portion is d, the maximum diameter of the target is D, and the distance between the target and the c-plane surface of the single-crystal substrate is H, the intermediate layer is formed under the condition that the relationship of D/H>d/h is established in the intermediate layer forming step.

8. The method according to claim 7, wherein the intermediate layer is formed by disposing the c-plane surface of the single-crystal substrate in plasma in the intermediate layer forming step.

* * * * *